(12) United States Patent
Jeon et al.

(10) Patent No.: US 12,349,567 B2
(45) Date of Patent: Jul. 1, 2025

(54) DISPLAY APPARATUS

(71) Applicant: Samsung Display Co., Ltd., Yongin-si (KR)

(72) Inventors: Yujin Jeon, Yongin-si (KR); Wonse Lee, Yongin-si (KR); Jiseon Lee, Yongin-si (KR); Donghyeon Jang, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 642 days.

(21) Appl. No.: 17/719,965

(22) Filed: Apr. 13, 2022

(65) Prior Publication Data

US 2023/0108936 A1 Apr. 6, 2023

(30) Foreign Application Priority Data

Oct. 5, 2021 (KR) .......................... 10-2021-0131969

(51) Int. Cl.
| | |
|---|---|
| *H10K 59/131* | (2023.01) |
| *G09G 3/3233* | (2016.01) |
| *H10K 59/123* | (2023.01) |
| *H10K 50/844* | (2023.01) |
| *H10K 50/86* | (2023.01) |

(52) U.S. Cl.
CPC ......... *H10K 59/131* (2023.02); *G09G 3/3233* (2013.01); *G09G 2320/0214* (2013.01); *H10K 50/844* (2023.02); *H10K 50/865* (2023.02); *H10K 59/123* (2023.02)

(58) Field of Classification Search
CPC ............... H10K 59/131; H10K 59/121; G09G 2300/0426; G09G 3/3233
See application file for complete search history.

(56) References Cited

U.S. PATENT DOCUMENTS

| | | | |
|---|---|---|---|
| 9,142,808 B2 | 9/2015 | Kim et al. | |
| 9,606,405 B2 * | 3/2017 | Yang | ................. G02F 1/136286 |
| 10,049,618 B2 | 8/2018 | Jeong | |

(Continued)

FOREIGN PATENT DOCUMENTS

| | | |
|---|---|---|
| CN | 111916486 A | 11/2020 |
| KR | 10-2016-0119909 A | 10/2016 |

(Continued)

*Primary Examiner* — Sophia T Nguyen

(74) *Attorney, Agent, or Firm* — Womble Bond Dickinson (US) LLP

(57) ABSTRACT

A display apparatus includes: a first-first data line located at a first portion of a main display area at one side of an auxiliary display area, and extending in a first direction from the first portion to the auxiliary display area; a first horizontal connection line electrically connected to the first-first data line, and extending in a second direction crossing the first direction; a first vertical connection line electrically connected to the first horizontal connection line, and extending in the first direction from the first portion of the main display area into the second portion of the main display area at another side of the auxiliary display area; a first peripheral connection line electrically connected to the first vertical connection line, and extending in the second direction; and a first-second data line extending in the first direction, and electrically connected to the first peripheral connection line.

20 Claims, 19 Drawing Sheets

(56) References Cited

U.S. PATENT DOCUMENTS

| | | | | |
|---|---|---|---|---|
| 10,229,964 | B2* | 3/2019 | Kim | H10K 59/121 |
| 10,707,281 | B2* | 7/2020 | Kuo | H10K 59/65 |
| 11,038,003 | B2* | 6/2021 | Park | H10K 59/40 |
| 11,069,302 | B2* | 7/2021 | Lee | H10K 59/131 |
| 11,227,538 | B2* | 1/2022 | Yang | H10K 59/121 |
| 11,711,953 | B2* | 7/2023 | Bok | G09G 3/3208 |
| | | | | 257/79 |
| 11,832,479 | B2* | 11/2023 | Kang | H10K 59/121 |
| 12,080,244 | B2* | 9/2024 | Jeong | H10K 59/12 |
| 12,136,389 | B2* | 11/2024 | Du | H10K 59/1216 |
| 12,225,782 | B2* | 2/2025 | You | H10K 50/844 |
| 2017/0162111 | A1* | 6/2017 | Kang | H10K 59/121 |
| 2018/0293936 | A1* | 10/2018 | Fujioka | H10K 59/1213 |
| 2020/0013849 | A1 | 1/2020 | Kim et al. | |
| 2020/0258967 | A1* | 8/2020 | Kim | H10K 59/17 |
| 2020/0302853 | A1* | 9/2020 | Ono | G09G 3/2074 |
| 2020/0312832 | A1* | 10/2020 | Chi | H10K 59/1315 |
| 2020/0388230 | A1* | 12/2020 | Lee | G09G 3/3275 |
| 2021/0066427 | A1* | 3/2021 | Ma | H04N 23/57 |
| 2021/0191552 | A1* | 6/2021 | Bok | H10K 59/38 |
| 2021/0208633 | A1* | 7/2021 | Ma | H10K 59/131 |
| 2021/0257594 | A1* | 8/2021 | Kim | H10K 50/858 |
| 2021/0313410 | A1* | 10/2021 | Kim | H10K 59/131 |
| 2021/0351255 | A1* | 11/2021 | Chang | H10K 50/868 |
| 2021/0359073 | A1* | 11/2021 | Cha | H10D 86/423 |
| 2021/0376279 | A1* | 12/2021 | Jeon | H10D 86/60 |
| 2021/0391407 | A1* | 12/2021 | Yoon | G06F 1/1626 |
| 2022/0068211 | A1* | 3/2022 | Jeong | H10K 59/123 |
| 2022/0069047 | A1* | 3/2022 | Yang | H10K 59/131 |
| 2022/0069048 | A1* | 3/2022 | Bok | H10K 59/131 |
| 2022/0093682 | A1* | 3/2022 | Chang | H10K 59/131 |
| 2022/0123094 | A1* | 4/2022 | Qiu | H10K 59/126 |
| 2022/0293692 | A1* | 9/2022 | Xu | H10K 59/65 |
| 2022/0319411 | A1* | 10/2022 | Cheng | G09G 3/3225 |
| 2022/0320260 | A1* | 10/2022 | Du | H10K 59/131 |
| 2022/0352292 | A1* | 11/2022 | Yang | H10K 59/122 |
| 2022/0376028 | A1* | 11/2022 | Huang | H10K 59/353 |
| 2023/0108936 | A1* | 4/2023 | Jeon | H10K 59/121 |
| | | | | 257/773 |
| 2023/0117888 | A1* | 4/2023 | Du | H10K 59/131 |
| | | | | 345/55 |
| 2023/0119107 | A1* | 4/2023 | Jeong | H10K 59/124 |
| | | | | 345/76 |
| 2023/0144984 | A1* | 5/2023 | Du | G09G 3/3225 |
| | | | | 345/204 |
| 2023/0337492 | A1* | 10/2023 | Feng | G09G 3/3233 |
| 2024/0114757 | A1* | 4/2024 | Yoon | G09G 3/3225 |

FOREIGN PATENT DOCUMENTS

| | | |
|---|---|---|
| KR | 10-2017-0114026 A | 10/2017 |
| KR | 10-1966688 B1 | 4/2019 |

* cited by examiner

DISPLAY APPARATUS

CROSS-REFERENCE TO RELATED APPLICATION

This application claims priority to and the benefit of Korean Patent Application No. 10-2021-0131969, filed on Oct. 5, 2021, in the Korean Intellectual Property Office, the entire disclosure of which is incorporated by reference herein.

BACKGROUND

1. Field

One or more embodiments relate to a display apparatus, and more particularly, to a display apparatus that may display high-quality images.

2. Description of the Related Art

Generally, display apparatuses such as organic light-emitting display apparatuses include thin-film transistors arranged in each (sub) pixel to control the brightness and the like of each (sub) pixel. The thin-film transistors are configured to control the brightness and the like of a corresponding (sub) pixel according to a data signal and the like transferred thereto.

SUMMARY

A display apparatus according to a comparative example may not be able to display high-quality images in a region where a camera is arranged.

One or more embodiments of the present disclosure are directed to a display apparatus that may display high-quality images. However, the aspects and features of the present disclosure are not limited thereto.

Additional aspects and features will be set forth, in part, in the description which follows, and in part, will be apparent from the description, or may be learned by practicing one or more of the presented embodiments of the present disclosure.

According to one or more embodiments of the present disclosure, a display apparatus includes: a substrate including an auxiliary display area, and a main display area surrounding the auxiliary display area, the auxiliary display area including a component area and an intermediate area; a first-first main pixel circuit, and a first-first main display element electrically connected to the first-first main pixel circuit, the first-first main pixel circuit and the first-first main display element being located at a first portion of the main display area, the first portion being at one side of the auxiliary display area; a first-second main pixel circuit, and a first-second main display element electrically connected to the first-second main pixel circuit, the first-second main pixel circuit and the first-second main display element being located at a second portion of the main display area, the second portion being at another side of the auxiliary display area; a first auxiliary pixel circuit, and a first auxiliary display element electrically connected to the first auxiliary pixel circuit, the first auxiliary pixel circuit and the first auxiliary display element being located at the intermediate area; a second auxiliary pixel circuit located at the intermediate area; a second auxiliary display element located at the component area; an auxiliary connection line connecting the second auxiliary display element to the second auxiliary pixel circuit; a first-first data line electrically connected to the first-first main pixel circuit, the first-first data line being located at the first portion of the main display area, and extending in a first direction from the first portion of the main display area to the auxiliary display area; a first horizontal connection line electrically connected to the first-first data line, the first horizontal connection line being located at the main display area, and extending in a second direction crossing the first direction; a first vertical connection line electrically connected to the first horizontal connection line, and extending in the first direction from the first portion of the main display area into the second portion of the main display area through the intermediate area; a first peripheral connection line electrically connected to the first vertical connection line extending in the second portion of the main display area, the first peripheral connection line extending in the second direction; and a first-second data line electrically connected to the first-second main pixel circuit, the first-second data line being located at the second portion of the main display area, and extending in the first direction to be electrically connected to the first peripheral connection line.

In an embodiment, the first-first main display element and the first-second main display element may be located at a same column as each other, the column extending in the first direction.

In an embodiment, the second auxiliary pixel circuit may be electrically connected to the first vertical connection line.

In an embodiment, the first-first data line, the first-second data line, and the first vertical connection line may be at a same layer as each other.

In an embodiment, the display apparatus may further include: a second-first main pixel circuit, and a second-first main display element electrically connected to the second-first main pixel circuit, the second-first main pixel circuit and the second-first main display element being located at the first portion of the main display area; a second-second main pixel circuit, and a second-second main display element electrically connected to the second-second main pixel circuit, the second-second main pixel circuit and the second-second main display element being located at the second portion of the main display area; and a second data line electrically connected to the second-first main pixel circuit and the second-second main pixel circuit, the second data line extending in the first direction to pass the first portion of the main display area, the intermediate area, and the second portion of the main display area.

In an embodiment, the second-first main display element and the second-second main display element may be located at a same column as each other, the column extending in the first direction.

In an embodiment, at least a portion of the first peripheral connection line may be located at a peripheral area outside the main display area.

In an embodiment, the display apparatus may further include: a third-first main pixel circuit, and a third-first main display element electrically connected to the third-first main pixel circuit, the third-first main pixel circuit and the third-first main display element being located at the first portion of the main display area; a third-second main pixel circuit, and a third-second main display element electrically connected to the third-second main pixel circuit, the third-second main pixel circuit and the third-second main display element being located at the second portion of the main display area; a third-first data line electrically connected to the third-first main pixel circuit, the third-first data line extending in the first direction, and located at the first portion of the main display area; a second horizontal connection line electrically connected to the third-first data line, the second horizontal connection line extending in the second direction, and located at the main display area; a second vertical connection line electrically connected to the second horizontal connection line, and extending in the first direction from the first portion of the main display area into the second portion of the main display area through the intermediate area; a second peripheral connection line electrically connected to the second vertical connection line extending in the second portion of the main display area, the second peripheral connection line extending in the second direction; and a third-second data line electrically connected to the third-second main pixel circuit, the third-second data line being located at the second portion of the main display area, and extending in the first direction to be electrically connected to the second peripheral connection line.

In an embodiment, the third-first main display element and the third-second main display element may be located at a same column as each other, the column extending in the first direction.

In an embodiment, the first auxiliary pixel circuit may be electrically connected to the second vertical connection line.

In an embodiment, the third-first data line, the third-second data line, and the second vertical connection line may be located at a same layer as each other.

In an embodiment, the display apparatus may further include: a second-first main pixel circuit, and a second-first main display element electrically connected to the second-first main pixel circuit, the second-first main pixel circuit and the second-first main display element being located at the first portion of the main display area; a second-second main pixel circuit, and a second-second main display element electrically connected to the second-second main pixel circuit, the second-second main pixel circuit and the second-second main display element being located at the second portion of the main display area; and a second data line electrically connected to the second-first main pixel circuit and the second-second main pixel circuit, the second data line extending in the first direction to pass the first portion of the main display area, the intermediate area, and the second portion of the main display area.

In an embodiment, the second-first main display element and the second-second main display element may be located at a same column as each other, the column extending in the first direction.

In an embodiment, the second horizontal connection line may cross the second data line, and the second horizontal connection line may be located at a layer different from that of the second data line.

In an embodiment, at least a portion of the second peripheral connection line may be located at a peripheral area outside the main display area.

In an embodiment, the display apparatus may further include: a first bridge line located between the first vertical connection line and the first peripheral connection line to electrically connect the first vertical connection line to the first peripheral connection line; and a second bridge line located between the second vertical connection line and the second peripheral connection line to electrically connect the second vertical connection line to the second peripheral connection line.

In an embodiment, the first peripheral connection line may be located at a layer different from that of the second peripheral connection line.

In an embodiment, the first peripheral connection line may cross the second peripheral connection line, and the first peripheral connection line may be located at a layer different from that of the second peripheral connection line.

In an embodiment, the first bridge line and the second bridge line may each be located on an insulating layer covering one of the first peripheral connection line or the second peripheral connection line.

In an embodiment, another of the first peripheral connection line or the second peripheral connection line may be located on an insulating layer covering the first bridge line and the second bridge line.

The above and/or other aspects and features of the present disclosure will become apparent and more readily appreciated from the following description of embodiments of the present disclosure, the accompanying drawings, and the claims and their equivalents.

BRIEF DESCRIPTION OF THE DRAWINGS

The above and other aspects and features of the present disclosure will be more clearly understood from the following detailed description of the illustrative, non-limiting embodiments with reference to the accompanying drawings, in which.

DETAILED DESCRIPTION

Figure 1:
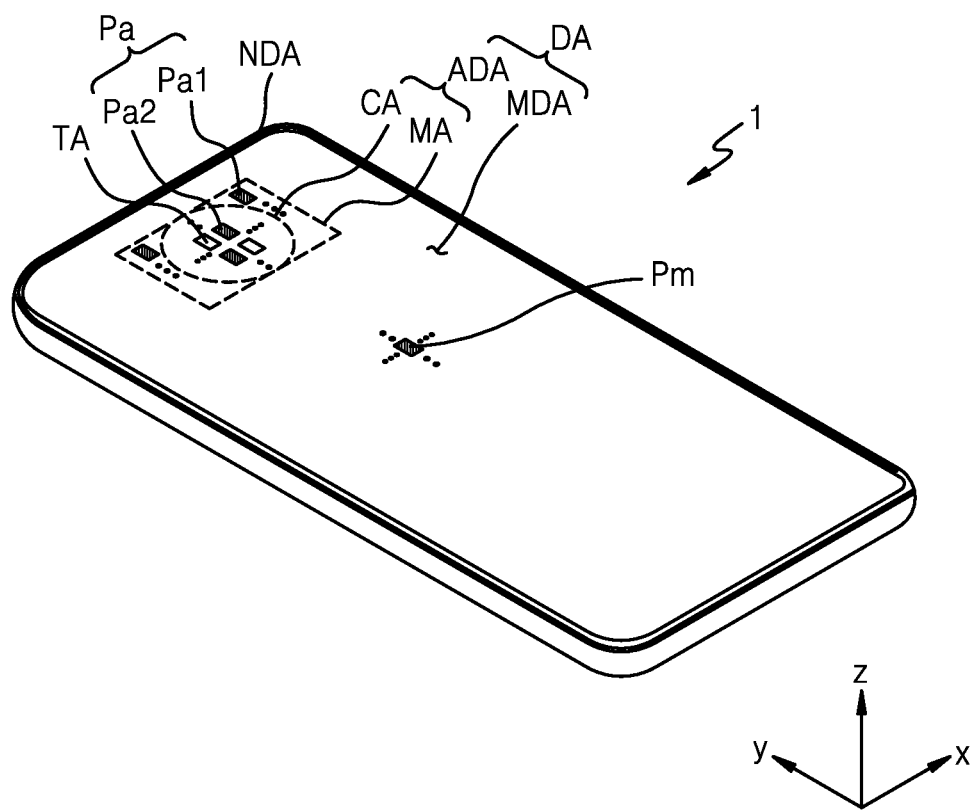
FIG. 1 is a perspective view of a display apparatus according to an embodiment.

Hereinafter, embodiments will be described in more detail with reference to the accompanying drawings, in which like reference numbers refer to like elements throughout. The present disclosure, however, may be embodied in various different forms, and should not be construed as being limited to only the illustrated embodiments herein. Rather, these embodiments are provided as examples so that this disclosure will be thorough and complete, and will fully convey the aspects and features of the present disclosure to those skilled in the art. Accordingly, processes, elements, and techniques that are not necessary to those having ordinary skill in the art for a complete understanding of the aspects and features of the present disclosure may not be described. Unless otherwise noted, like reference numerals denote like elements throughout the attached drawings and the written description, and thus, redundant description thereof may not be repeated.

When a certain embodiment may be implemented differently, a specific process order may be different from the described order. For example, two consecutively described processes may be performed at the same or substantially at the same time, or may be performed in an order opposite to the described order.

In the drawings, the relative sizes of elements, layers, and regions may be exaggerated and/or simplified for clarity. Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

In the figures, the x-axis, the y-axis, and the z-axis are not limited to three axes of the rectangular coordinate system, and may be interpreted in a broader sense. For example, the x-axis, the y-axis, and the z-axis may be perpendicular to or substantially perpendicular to one another, or may represent different directions from each other that are not perpendicular to one another.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

It will be understood that when an element or layer is referred to as being "on," "connected to," or "coupled to" another element or layer, it can be directly on, connected to, or coupled to the other element or layer, or one or more intervening elements or layers may be present. Similarly, when a layer, an area, or an element is referred to as being "electrically connected" to another layer, area, or element, it may be directly electrically connected to the other layer, area, or element, and/or may be indirectly electrically connected with one or more intervening layers, areas, or elements therebetween. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments and is not intended to be limiting of the present disclosure. As used herein, the singular forms "a" and "an" are intended to include the plural forms as well, unless the context clearly indicates otherwise. It will be further understood that the terms "comprises," "comprising," "includes," "including," "has," "have," and "having," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. For example, the expression "A and/or B" denotes A, B, or A and B. Expressions such as "at least one of," when preceding a list of elements, modify the entire list of elements and do not modify the individual elements of the list. For example, the expression "at least one of a, b, or c" indicates only a, only b, only c, both a and b, both a and c, both b and c, all of a, b, and c, or variations thereof.

As used herein, the term "substantially," "about," and similar terms are used as terms of approximation and not as terms of degree, and are intended to account for the inherent variations in measured or calculated values that would be recognized by those of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively. Also, the term "exemplary" is intended to refer to an example or illustration.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

FIG. 1 is a perspective view of a display apparatus 1 according to an embodiment. For reference, hereinafter, it will be understood that a pixel may denote a sub-pixel.

Referring to FIG. 1, the display apparatus 1 according to an embodiment includes a display area DA, and a peripheral area NDA outside the display area DA. The display area DA may include an auxiliary display area ADA, and a main display area MDA surrounding (e.g., around a periphery of) the auxiliary display area ADA. The auxiliary display area ADA may be configured to display auxiliary images, and the main display area MDA may be configured to display main images. Accordingly, the auxiliary display area ADA and the main display area MDA may be configured to display images individually from each other and/or in cooperation with each other. The peripheral area NDA may be a kind of non-display area at (e.g., in or on) which elements are not arranged. The display area DA may be surrounded (e.g., around a periphery thereof) by the peripheral area NDA. For example, the peripheral area NDA may entirely surround (e.g., around a periphery of) the display area DA.

FIG. 1 shows as an example in which the display apparatus 1 includes one auxiliary display area ADA, and the main display area MDA surrounds (e.g., around a periphery of) the auxiliary display area ADA. However, the present disclosure is not limited thereto. As another example, the display apparatus 1 may include a plurality of auxiliary display areas ADA, and the main display area MDA may surround (e.g., around a periphery of) the plurality of auxiliary display areas ADA and may be arranged between the plurality of auxiliary display areas ADA. In this case, the shapes and the sizes of the auxiliary display areas ADA may be the same as each other or may be different from each other.

When viewed in a direction (e.g., a z direction) that is approximately perpendicular to (e.g., that is perpendicular to or substantially perpendicular to) an upper surface of the display apparatus 1 (e.g., in a plan view), the auxiliary display area ADA may have various suitable shapes, for example, such as a circular shape, an elliptical shape, a polygon shape such as a quadrangle, a star shape, a diamond shape, or the like. In addition, while FIG. 1 shows that the auxiliary display area ADA is arranged at (e.g., in or on) an upper (e.g., in a +y direction) center side of the main display area MDA having an approximately quadrangular shape (e.g., having a quadrangular or substantially quadrangular shape) when viewed in a direction (e.g., the z direction) that is approximately perpendicular to (e.g., that is perpendicular to or substantially perpendicular to) the upper surface of the display apparatus 1 (e.g., in a plan view), the present disclosure is not limited thereto, and the auxiliary display area ADA may be arranged at (e.g., in or on) one side of the main display area MDA having a quadrangular shape, for example, such as the upper right side or the upper left side of the main display area MDA.

The display apparatus 1 may display images by using a plurality of main pixels Pm and a plurality of auxiliary pixels Pa. The plurality of auxiliary pixels Pa may include, for example, a first auxiliary pixel Pa1 and a second auxiliary pixel Pa2. The plurality of main pixels Pm are arranged at (e.g., in or on) the main display area MDA. The plurality of auxiliary pixels Pa including the first auxiliary pixel Pa1 and the second auxiliary pixel Pa2 are arranged at (e.g., in or on) the auxiliary display area ADA. The auxiliary display area ADA may include a component area CA, and an intermediate area MA that at least partially surrounds (e.g., around a periphery of) the component area CA. Accordingly, the intermediate area MA may be arranged between the component area CA and the main display area MDA.

As described in more detail below with reference to FIG. 2, a component 40 (e.g., see FIG. 2), which may be an electronic element, may be arranged below (e.g., underneath) a display panel to correspond to the component area CA. The component area CA may include a transmission area TA. The transmission area TA may transmit light and/or sound that is output from the component 40 to the outside, and/or light and/or sound that progress toward the component 40 from the outside.

The component 40 may be an electronic element that uses light or sound. As an example, the electronic element may be a sensor that measures a distance, for example, such as a proximity sensor, a sensor that recognizes a portion of a user's body, for example, such as a fingerprint, an iris, or a face, a small lamp that outputs light, or an image sensor that captures an image, for example, such as a camera. The electronic element that uses light may use light in various suitable wavelength bands, for example, such as visible light, infrared light, or ultraviolet light. The electronic element that uses sound may use ultrasonic waves or sound in different frequency bands. In an embodiment, the component 40 may include one or more sub-components, for example, such as a light-emitter and a light-receiver. The component 40 may include the light-emitter and the light-receiver that are integrated into one body, or a pair of a light-emitter and a light-receiver having physically separated structures may constitute one component 40.

In the display apparatus 1 according to an embodiment, when light passes through the component area CA, light transmittance thereof may be 10% or more, 20% or more, 30% or more, 40% or more, 50% or more, 60% or more, 70% or more, 75% or more, 80% or more, 85% or more, or 90% or more.

The plurality of auxiliary pixels Pa including the first auxiliary pixel Pa1 and the second auxiliary pixel Pa2 may be arranged at (e.g., in or on) the auxiliary display area ADA. The first auxiliary pixel Pa1 may be arranged at (e.g., in or on) the intermediate area MA, and the second auxiliary pixel Pa2 may be arranged at (e.g., in or on) the component area CA.

The plurality of auxiliary pixels Pa including the first auxiliary pixel Pa1 and the second auxiliary pixel Pa2 may display a desired image (e.g., a preset or predefined image) by emitting light. An image displayed in the auxiliary display area ADA may be an auxiliary image, and may have a resolution that is less than that of an image displayed in the main display area MDA. In other words, because the component area CA inside the auxiliary display area ADA includes the transmission area TA through which light and/or sound may pass, in the case where pixels are not arranged at (e.g., in or on) the transmission area TA, the number of second auxiliary pixels Pa2 per a unit area in the component area CA may be less than a number of main pixels Pm per a unit area in the main display area MDA.

In addition, even though the intermediate area MA inside the auxiliary display area ADA may not include the transmission area TA, because some pixel circuits (e.g., a second auxiliary pixel circuit PCa2 shown in FIG. 2) may be arranged at (e.g., in or on) the intermediate area MA to drive the second auxiliary pixels Pa2, the number of first auxiliary pixels Pa1 per unit area in the intermediate area MA may be less than the number of main pixels Pm per unit area in the main display area MDA.

Hereinafter, an organic light-emitting display apparatus is described in more detail as an example of the display apparatus 1 according to an embodiment, but the present disclosure is not limited thereto. As an example, in some embodiments, the display apparatus 1 may be an inorganic light-emitting display apparatus or a quantum-dot light-emitting display apparatus. For example, an emission layer of a display element of the display apparatus 1 may include an organic material, an inorganic material, or an organic material and quantum dots. In addition, the display apparatus 1 may include quantum dots to convert a wavelength of light.

Figure 2:
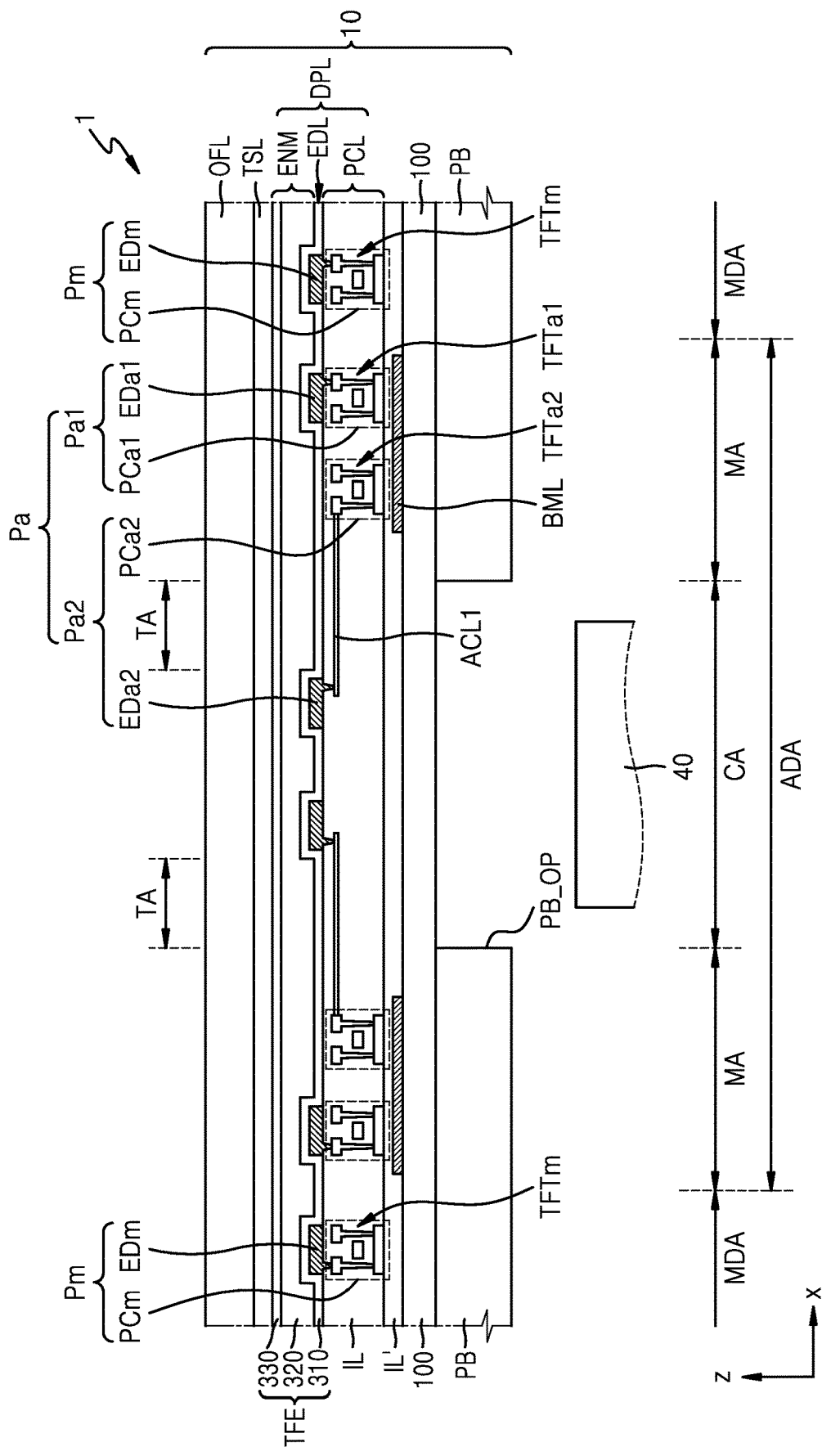
FIG. 2 is a cross-sectional view of a portion of a display apparatus according to an embodiment.

FIG. 2 is a cross-sectional view of a portion of the display apparatus 1 according to an embodiment.

As shown in FIG. 2, the display apparatus 1 may include a display panel 10, and the component 40 overlapping with the display panel 10. A cover window for protecting the display panel 10 may be further arranged on the display panel 10.

The display panel 10 may include the auxiliary display area ADA and the main display area MDA. Auxiliary images may be displayed in the auxiliary display area ADA, and main images may be displayed in the main display area MDA. The auxiliary display area ADA may include the component area CA and the intermediate area MA. The component area CA may overlap with the component 40, and the intermediate area MA may surround (e.g., around a periphery of) the component area CA.

The display panel 10 may include a substrate 100, a display layer DPL, a touchscreen layer TSL, an optical functional layer OFL, and a panel protection member PB. The display layer DPL, the touchscreen layer TSL, and the optical functional layer OFL may be on (e.g., on above) the substrate 100, and the panel protection member PB may be under (e.g., on under or underneath) the substrate 100.

The display layer DPL may include a circuit layer PCL, a display element layer EDL, and an encapsulation member ENM. The circuit layer PCL may include thin-film transistors TFTm, TFTa1, and TFTa2. The display element layer EDL may include display elements EDm, EDa1, and EDa2, which are light-emitting elements. The encapsulation member ENM may include a thin-film encapsulation layer TFE. However, the present disclosure is not limited thereto, and the encapsulation member ENM may include an encapsulation substrate instead of the thin-film encapsulation layer TFE. Insulating layers IL and IL' may be arranged between the substrate 100 and the display layer DPL, and inside the display layer DPL. The display elements EDm, EDa1, and EDa2 may each be an organic light-emitting diode OLED (see FIG. 5).

The substrate 100 may include glass, a metal, or a polymer resin. In the case where the display panel 10 is flexible and/or bendable, the substrate 100 may include the polymer resin including, for example, polyethersulfone, polyacrylate, polyetherimide, polyethylene naphthalate, polyethylene terephthalate, polyphenylene sulfide, polyarylate, polyimide, polycarbonate, and/or cellulose acetate propionate. The substrate 100 may include a multi-layered structure including two layers and a barrier layer. In this case, the two layers may include the polymer resin, and the barrier layer may include an inorganic material (e.g., silicon oxide, silicon nitride, silicon oxynitride, and/or the like) arranged between the two layers. However, the present disclosure is not limited thereto, and various suitable modifications may be made as would be appreciated by those having ordinary skill in the art.

The main pixel Pm may include a main display element EDm, and a main pixel circuit PCm connected to the main display element EDm. The main display element EDm may be arranged at (e.g., in or on) the main display area MDA of the display panel 10. The main pixel circuit PCm may include at least one thin-film transistor TFTm configured to control a light-emission of the main display element EDm, a light-emitting degree, or the like.

The first auxiliary pixel Pa1 may include a first auxiliary display element EDa1, and a first auxiliary pixel circuit PCa1 connected to the first auxiliary display element EDa1. The first auxiliary pixel Pa1 may be arranged at (e.g., in or on) the intermediate area MA of the display panel 10. The first auxiliary pixel circuit PCa1 may include at least one thin-film transistor TFTa1 configured to control a light-emission of the first auxiliary display element EDa1, a light-emitting degree, or the like.

The second auxiliary pixel Pa2 may include a second auxiliary display element EDa2, and a second auxiliary pixel circuit PCa2 connected to the second auxiliary display element EDa2. The second auxiliary display element EDa2 is arranged at (e.g., in or on) the component area CA of the display panel 10. The second auxiliary pixel circuit PCa2 may be arranged at (e.g., in or on) the intermediate area MA instead of the component area CA. The second auxiliary pixel circuit PCa2 may include at least one thin-film transistor TFTa2 configured to control a light-emission of the second auxiliary display element EDa2, a light-emitting degree, or the like. The second auxiliary display element EDa2 may be electrically connected to the second auxiliary pixel circuit PCa2 by a first auxiliary connection line ACL1 to implement the second auxiliary pixel Pa2. The first auxiliary connection line ACL1 may include a transparent conductive material.

A region of the component area CA at (e.g., in or on) which the second auxiliary display element EDa2 is not arranged may be defined as the transmission area TA. The transmission area TA may be a region through which light/signal emitted from the component 40 or light/signal incident to the component 40 pass, the component 40 being arranged to correspond to the component area CA.

The first auxiliary connection line ACL1 connecting the second auxiliary pixel circuit PCa2 to the second auxiliary display element EDa2 may be arranged at (e.g., in or on) the transmission area TA. Because the first auxiliary connection line ACL1 may include a transparent conductive material having a high transmittance, even though the first auxiliary connection line ACL1 is arranged at (e.g., in or on) the transmission area TA, the transmission area TA may secure a sufficient transmittance. In the display apparatus 1 according to an embodiment, because the second auxiliary pixel circuit PCa2 is not arranged at (e.g., in or on) the component area CA, the area of the transmission area TA may be extended (e.g., may be easily extended), and a light transmittance of the transmission area TA may be further increased.

As shown in FIG. 2, the display element layer EDL may be covered by the thin-film encapsulation layer TFE (or an encapsulation substrate). In an embodiment, as shown in FIG. 2, the thin-film encapsulation layer TFE may include at least one inorganic encapsulation layer and at least one organic encapsulation layer. As an example, the thin-film encapsulation layer TFE may include a first inorganic encapsulation layer 310, a second inorganic encapsulation layer 330, and an organic encapsulation layer 320 between the first and second inorganic encapsulation layers 310 and 330.

The first inorganic encapsulation layer 310 and the second inorganic encapsulation layer 330 may each include at least one inorganic insulating material, for example, such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_x$), and be formed by chemical vapor deposition (CVD). Zinc oxide ($ZnO_x$) may be ZnO and/or $ZnO_2$. The organic encapsulation layer 320 may include a polymer-based material. The polymer-based material may include an acryl-based resin (e.g., polymethylmethacrylate, poly acrylic acid, and/or the like), an epoxy-based resin, polyimide, and/or polyethylene.

The first inorganic encapsulation layer 310, the organic encapsulation layer 320, and the second inorganic encapsulation layer 330 may each be formed as one body to cover the main display area MDA and the auxiliary display area ADA.

The touchscreen layer TSL may obtain coordinate information corresponding to an external input, for example, such as a touch event. The touchscreen layer TSL may include a touch electrode, and touch wirings connected to the touch electrode. The touchscreen layer TSL may sense the external input by using a self-capacitance method or a mutual capacitance method.

The touchscreen layer TSL may be arranged on the thin-film encapsulation layer TFE. As another example, the touchscreen layer TSL may be separately formed on a touch substrate, and then arranged on the thin-film encapsulation layer TFE through an adhesive layer, for example, such as an optically clear adhesive OCA. In an embodiment, the touchscreen layer TSL may be formed directly on the thin-film encapsulation layer TFE. In this case, an adhesive layer may not be arranged between the touchscreen layer TSL and the thin-film encapsulation layer TFE.

The optical functional layer OFL may include an anti-reflection layer. The anti-reflection layer may reduce a reflectivity of light (e.g., external light) incident toward the display apparatus 1 from the outside. In an embodiment, the optical functional layer OFL may include (e.g., may be) a polarizing film. In some embodiments, the optical functional layer OFL may increase a light transmittance of the transmission area TA by including an opening corresponding to the transmission area TA when needed or desired, but the present disclosure is not limited thereto. In this case, a transparent material, for example, such as an optically clear resin (OCR), may fill the opening. In some embodiments, the optical functional layer OFL may include (e.g., may be) a filter plate including a black matrix and color filters when needed or desired, but the present disclosure is not limited thereto.

The panel protection member PB may be attached under (e.g., underneath) the substrate 100 to support and protect the substrate 100. The panel protection member PB may have an opening PB_OP corresponding to the component area CA. Because the panel protection member PB has the opening PB_OP, a light transmittance of the component area CA may be improved. The panel protection member PB may include polyethylene terephthalate or polyimide.

The area of the component area CA may be greater than an area in which the component 40 is arranged. Accordingly, the area of the opening PB_OP of the panel protection member PB may not coincide with the area of the component area CA. While FIG. 2 shows that the component 40 may be spaced apart from the display panel 10, the present disclosure is not limited thereto, and at least a portion of the component 40 may be inserted into the opening PB_OP of the panel protection member PB.

A plurality of components 40 may be arranged at (e.g., in or on) the component area CA when necessary or desired. In this case, the plurality of components 40 may have different functions from one another. As an example, the plurality of components 40 may include at least two from among a photographing element (e.g., a camera), a solar battery, a flash, a proximity sensor, an illuminance sensor, and/or an iris sensor.

As shown in FIG. 2, a bottom metal layer BML may be arranged below (e.g., underneath) the first auxiliary pixel circuit PCa1 and the second auxiliary pixel circuit PCa2 at (e.g., in or on) the intermediate area MA. The bottom metal layer BML may overlap with the pixel circuits to protect the pixel circuits. As an example, the bottom metal layer BML may overlap with the first auxiliary pixel circuit PCa1 and the second auxiliary pixel circuit PCa2 between the substrate 100 and the first and second auxiliary pixel circuits PCa1 and PCa2. The bottom metal layer BML may prevent or reduce external light from reaching and influencing the first auxiliary pixel circuit PCa1 and the second auxiliary pixel circuit PCa2. In some embodiments, the bottom metal layer BML may be formed to correspond to an entirety of the display area DA as needed or desired, and may include a bottom-hole corresponding to the component area CA. However, the present disclosure is not limited thereto, and the display apparatus 1 may not include the bottom metal layer BML.

Figure 3:
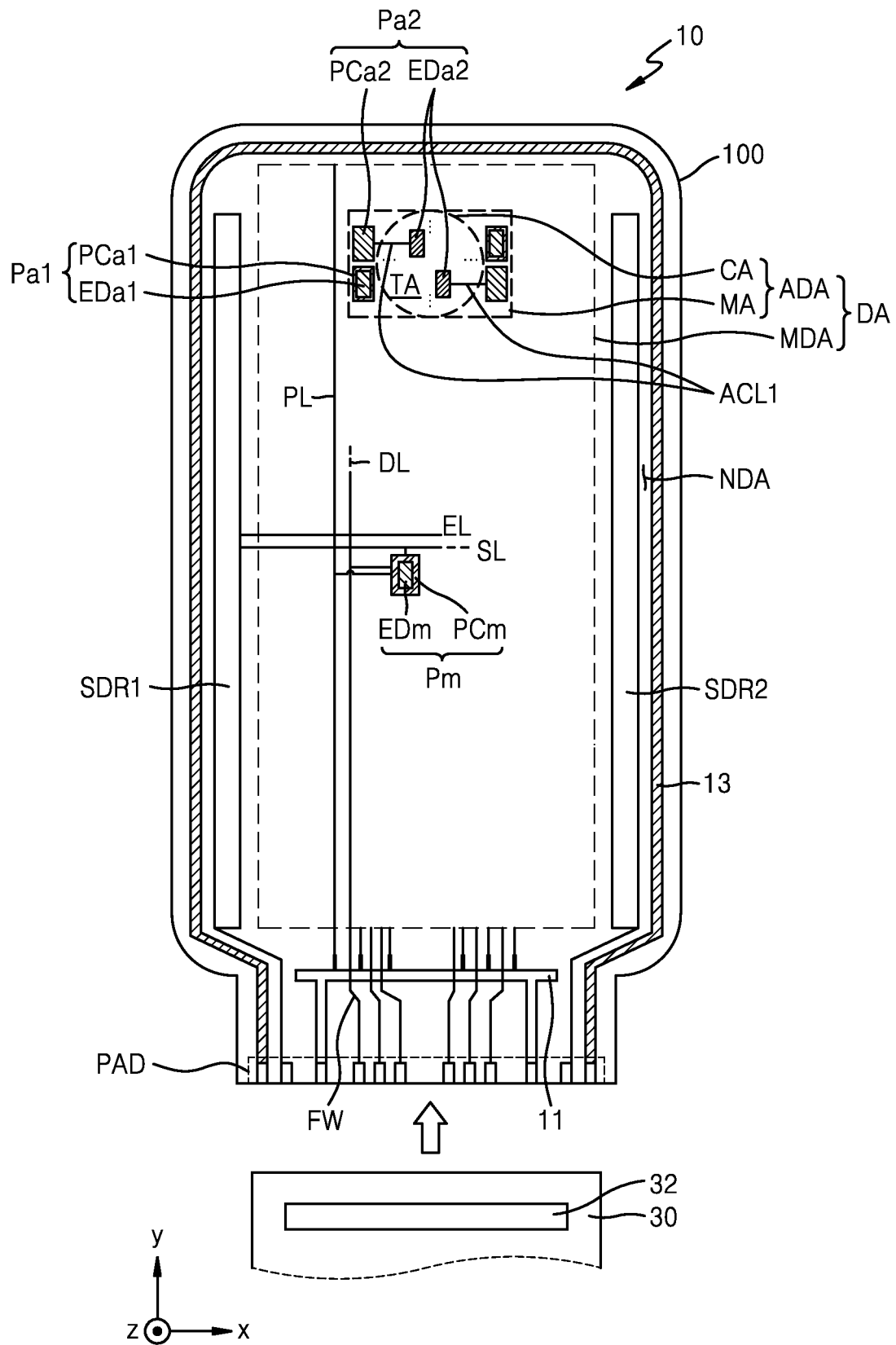
FIG. 3 is a plan view of a display panel that may be included in the display apparatus of FIG. 1.

FIG. 3 is a plan view of the display panel 10 that may be included in the display apparatus 1 of FIG. 1.

A plurality of main pixels Pm are arranged at (e.g., in or on) the main display area MDA. The main pixels Pm may each include a corresponding main display element EDm, for example, such as an organic light-emitting diode OLED. The main pixel Pm includes the main pixel circuit PCm configured to control the main display element EDm. The main pixel circuit PCm may overlap with the main display element EDm. Each main pixel Pm may emit a suitable color of light, for example, such as red, green, blue, or white light. The main display area MDA may be protected from external air, moisture, and/or the like by being covered by the encapsulation member ENM.

The plurality of auxiliary pixels Pa including the first auxiliary pixel Pa1 and the second auxiliary pixel Pa2 may be arranged at (e.g., in or on) the auxiliary display area ADA, which may be surrounded (e.g., around a periphery thereof) by the main display area MDA. Each of the plurality of auxiliary pixels Pa including the first auxiliary pixel Pa1 and the second auxiliary pixel Pa2 may emit a suitable color of light, for example, such as red, green, blue, or white light. The auxiliary display area ADA may be protected from external air, moisture, and/or the like by being covered by the encapsulation member ENM.

The auxiliary display area ADA may include the component area CA, and the intermediate area MA surrounding (e.g., around a periphery of) the component area CA. The first auxiliary pixel Pa1 may include the first auxiliary display element EDa1, for example, such as an organic light-emitting diode OLED. The second auxiliary pixel Pa2 may include the second auxiliary display element EDa2, for example, such as an organic light-emitting diode OLED. The first auxiliary display element EDa1 may be arranged at (e.g., in or on) the intermediate area MA, and the second auxiliary display element EDa2 may be arranged at (e.g., in or on) the component area CA.

The first auxiliary pixel Pa1 includes the first auxiliary pixel circuit PCa1 configured to control the first auxiliary display element EDa1, and the second auxiliary pixel Pa2 includes the second auxiliary pixel circuit PCa2 configured to control the second auxiliary display element EDa2. Both of the first auxiliary pixel circuit PCa1 and the second auxiliary pixel circuit PCa2 may be arranged at (e.g., in or on) the intermediate area MA. Accordingly, the second auxiliary display element EDa2 may be connected to the second auxiliary pixel circuit PCa2 by the first auxiliary connection line ACL1.

As described above, the component area CA may include the transmission area TA. The transmission area TA may be defined as a region at (e.g., in or on) which the second auxiliary display element EDa2 is not arranged. As described above, because the component area CA includes the transmission area TA, the resolution of the component area CA may be less than the resolution of the main display area MDA. As an example, the resolution of the component area CA may be about $\frac{1}{2}$, $\frac{3}{8}$, $\frac{1}{3}$, $\frac{1}{4}$, $\frac{2}{9}$, $\frac{1}{8}$, $\frac{1}{9}$, $\frac{1}{16}$, or the like of the resolution of the main display area MDA. For example, the resolution of the main display area MDA may be about 400 ppi, and the resolution of the component area CA may be about 200 ppi or about 100 ppi.

The pixel circuits PCm, PCa1, and PCa2 of the pixels Pm, Pa1, and Pa2 in the display area DA may each be electrically connected to outer circuits arranged at (e.g., in or on) the peripheral area NDA. A first scan driving circuit SDR1, a second scan driving circuit SDR2, a terminal part PAD, a driving voltage supply line 11, and a common voltage supply line 13 may be arranged at (e.g., in or on) the peripheral area NDA.

The first scan driving circuit SDR1 may be arranged at (e.g., in or on) one side (e.g., in a −x direction) of the display area DA. The second scan driving circuit SDR2 may be arranged to be symmetrical or substantially symmetrical with the first scan driving circuit SDR1 around the main display area MDA. The first scan driving circuit SDR1 may be connected to some of the main pixel circuits PCm through a scan line SL to apply a scan signal thereto. The second scan driving circuit SDR2 may be connected to others of the main pixel circuits PCm through a scan line to apply a scan signal thereto. The first scan driving circuit SDR1 may be connected to some of the main pixel circuits PCm through an emission control line EL to apply an emission control signal thereto. The second scan driving circuit SDR2 may be connected to others of the main pixel circuits PCm through an emission control line to apply an emission control signal thereto. The first scan driving circuit SDR1 or the second scan driving circuit SDR2 may be configured to apply a scan signal and the like to the first auxiliary pixel circuit PCa1 and the second auxiliary pixel circuit PCa2.

The terminal part PAD may be arranged at (e.g., in or on) one side of the display substrate 100. The terminal part PAD may be exposed by not being covered by an insulating layer, and may be connected to a display circuit board 30. A display driver 32 may be arranged on the display circuit board 30.

The display driver 32 may be configured to generate a control signal transferred to the first scan driving circuit SDR1 and the second scan driving circuit SDR2. The display driver 32 may be configured to generate a data signal, and the generated data signal may be transferred to the main pixel circuit PCm, the first auxiliary pixel circuit PCa1, and the second auxiliary pixel circuit PCa2 through a fan-out wiring FW and a data line DL connected to the fan-out wiring FW.

The display driver 32 may be configured to supply a driving voltage ELVDD (see FIG. 5) to the driving voltage supply line 11, and supply a common voltage ELVSS (see FIG. 5) to the common voltage supply line 13. The driving voltage ELVDD may be applied to the main pixel circuit PCm, the first auxiliary pixel circuit PCa1, and the second auxiliary pixel circuit PCa2 through a driving voltage line PL connected to the driving voltage supply line 11. The common voltage ELVSS may be applied to opposite electrodes of the main display element EDm, the first auxiliary display element EDa1, and the second auxiliary display element EDa2 through the common voltage supply line 13.

The driving voltage supply line 11 may extend in the x-direction at a location below the main display area MDA. The common voltage supply line 13 may have a loop shape having one open side to partially surround (e.g., around a periphery of) the main display area MDA.

Figure 4:
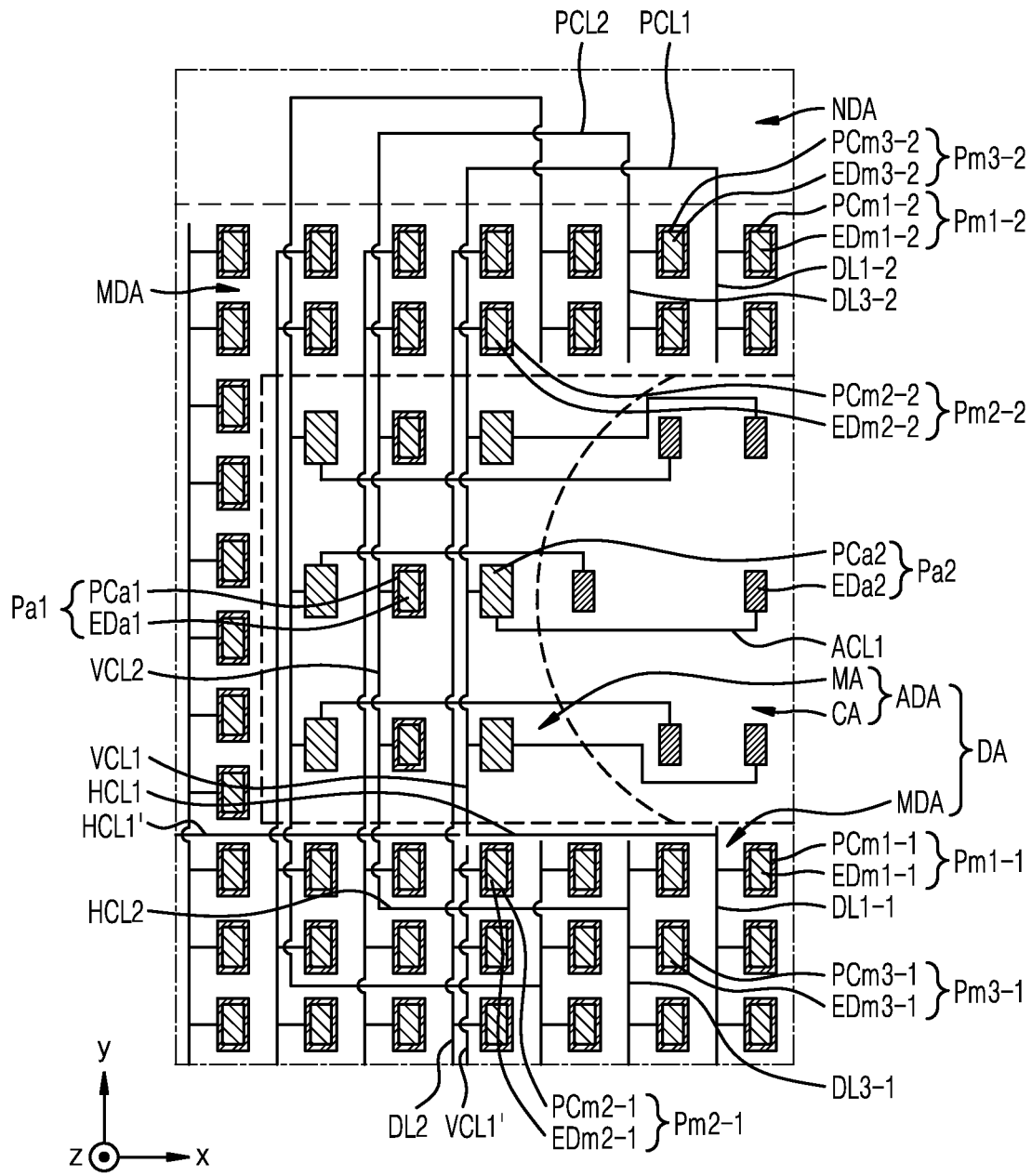
FIG. 4 is a conceptual view of a portion of the display panel of FIG. 3.

FIG. 4 is a conceptual view of a portion of the display panel 10 of FIG. 3.

As shown in FIG. 4, the plurality of main pixels Pm are arranged at (e.g., in or on) the main display area MDA. As an example, a first-first main pixel Pm1-1 is arranged at (e.g., in or on) a first portion of the main display area MDA. The first portion of the main display area MDA is at (e.g., in or on) one side (e.g., in a −y direction) of the auxiliary display area ADA. The first-first main pixel Pm1-1 includes a first-first main pixel circuit PCm1-1, and a first-first main display element EDm1-1 electrically connected to the first-first main pixel circuit PCm1-1. In addition, a first-second main pixel Pm1-2 is arranged at (e.g., in or on) a second portion of the main display area MDA. The second portion of the main display area MDA is at (e.g., in or on) another side (e.g., in a +y direction) of the auxiliary display area ADA. The first-second main pixel Pm1-2 includes a first-second main pixel circuit PCm1-2, and a first-second main display element EDm1-2 electrically connected to the first-second main pixel circuit PCm1-2. As shown in FIG. 4, the first-first main pixel circuit PCm1-1 may overlap with the first-first main display element EDm1-1, and the first-second main pixel circuit PCm1-2 may overlap with the first-second main display element EDm1-2.

The plurality of auxiliary pixels Pa are arranged at (e.g., in or on) the auxiliary display area ADA. The first auxiliary pixel circuit PCa1, the second auxiliary pixel circuit PCa2, and the first auxiliary display element EDa1 electrically connected to the first auxiliary pixel circuit PCa1 are arranged at (e.g., in or on) the intermediate area MA included in the auxiliary display area ADA. The second auxiliary display element EDa2 is arranged at (e.g., in or on) the component area CA surrounded (e.g., around a periphery thereof) by the intermediate area MA. As shown in FIG. 4, the first auxiliary pixel circuit PCa1 may overlap with the first auxiliary display element EDa1, and the second auxiliary pixel circuit PCa2 may be spaced apart from the second auxiliary display element EDa2 and may be electrically connected to the second auxiliary display element EDa2 by the first auxiliary connection line ACL1. However, the present disclosure is not limited thereto, and in some embodiments, in the case of the first auxiliary pixel Pa1, the organic light-emitting diode OLED, which is the first auxiliary display element EDa1, may not overlap with the first auxiliary pixel circuit PCa1.

A first-first data line DL1-1 is arranged at (e.g., in or on) the first portion of the main display area MDA, and extends in a first direction (e.g., a y-axis direction) from the first portion of the main display area MDA to the auxiliary display area ADA. The first-first data line DL1-1 is electrically connected to the first-first main pixel circuit PCm1-1. The main pixels Pm arranged at (e.g., in or on) the first portion of the main display area MDA, and belonging to the same column as that of the first-first main pixel Pm1-1, may be electrically connected to the first-first data line DL1-1.

Similarly, a first-second data line DL1-2 is arranged at (e.g., in or on) the second portion of the main display area MDA, and is electrically connected to the first-second main pixel circuit PCm1-2. The first-second data line DL1-2 extends in the first direction (e.g., the y-axis direction). In addition, the main pixels Pm arranged at (e.g., in or on) the second portion of the main display area MDA, and belonging to the same column as that of the first-second main pixel Pm1-2, may be electrically connected to the first-second data line DL1-2.

The first-first data line DL1-1 is electrically connected to the first-second data line DL1-2. In more detail, the first-first data line DL1-1 is electrically connected to the first-second data line DL1-2 through a first horizontal connection line HCL1, a first vertical connection line VCL1, and a first peripheral connection line PCL1.

The first horizontal connection line HCL1 is arranged at (e.g., in or on) the first portion of the main display area MDA, and extends in the second direction (e.g., the x-axis direction) crossing the first direction. One end of the first horizontal connection line HCL1 is electrically connected to the first-first data line DL1-1. The first vertical connection line VCL1 is electrically connected to another end of the first horizontal connection line HCL1, and extends in the first direction (e.g., the y-axis direction) from the first portion of the main display area MDA into the second portion of the main display area MDA through the intermediate area MA. One end of the first peripheral connection line PCL1 is electrically connected to the first vertical connection line VCL1 at (e.g., in or on) the second portion of the main display area MDA, and extends approximately in the second direction (e.g., the x-axis direction). Another end of the first peripheral connection line PCL1 is electrically connected to the first-second data line DL1-2. At least a portion of the first peripheral connection line PCL1 may be arranged at (e.g., in or on) the peripheral area NDA outside the main display area MDA.

As described above, the display apparatus 1 according to the present embodiment may be configured to apply data signals to main pixels Pm belonging to the same column as each other extending in the first direction, including the first-first main pixel Pm1-1 and the first-second main pixel Pm1-2, through the first-first data line DL1-1 and the first-second data line DL1-2 electrically connected to the first-first main pixel Pm1-1 and the first-second main pixel Pm1-2.

The second auxiliary pixel circuit PCa2 arranged at (e.g., in or on) the intermediate area MA is electrically connected to the first vertical connection line VCL1. As described above, the first vertical connection line VCL1 is electrically connected to the first-first data line DL1-1 through the first horizontal connection line HCL1. Thus, the display apparatus 1 may be configured to apply data signals to the second auxiliary pixel circuit PCa2 arranged at (e.g., in or on) the intermediate area MA through the first-first data line DL1-1, the first horizontal connection line HCL1, and the first vertical connection line VCL1. Accordingly, the display apparatus 1 may be configured to control a light-emission of the second auxiliary pixel Pa2, a light-emitting degree, and the like, the second auxiliary pixel Pa2 including the second auxiliary pixel circuit PCa2 and the second auxiliary display element EDa2. In other words, the first vertical connection line VCL1 may be configured to apply data signals to the second auxiliary pixel Pa2 including the second auxiliary pixel circuit PCa2 and the second auxiliary display element EDa2. As described above, in the display apparatus 1 according to the present embodiment, images may be effectively displayed not only in the first and second portions of the main display area MDA, but in the component area CA as well.

As shown in FIG. 4, a second-first main pixel Pm2-1 and a second-second main pixel Pm2-2 may be arranged at (e.g., in or on) the main display area MDA. A column in which the second-first main pixel Pm2-1 and the second-second main pixel Pm2-2 are arranged may be different from the column in which the first-first main pixel Pm1-1 and the first-second main pixel Pm1-2 are arranged.

The second-first main pixel Pm2-1 is arranged at (e.g., in or on) the first portion of the main display area MDA. The second-first main pixel Pm2-1 includes a second-first main pixel circuit PCm2-1, and a second-first main display element EDm2-1 electrically connected to the second-first main pixel circuit PCm2-1. In addition, the second-second main pixel Pm2-2 is arranged at (e.g., in or on) the second portion of the main display area MDA. The second-second main pixel Pm2-2 includes a second-second main pixel circuit PCm2-2, and a second-second main display element EDm2-2 electrically connected to the second-second main pixel circuit PCm2-2. The second-first main pixel element PCm2-1 may overlap with the second-first main display element EDm2-1, and the second-second main pixel circuit PCm2-2 may overlap with the second-second main display element EDm2-2. In addition, the second-first main display element EDm2-1 and the second-second main display element EDm2-2 may be arranged at (e.g., in or on) the same column as each other extending in the first direction.

The second data line DL2 extending in the first direction (e.g., the y-axis direction) passes through the first portion of the main display area MDA at (e.g., in or on) one side (e.g., in the −y direction) of the auxiliary display area ADA and the intermediate area MA to the second portion of the main display area MDA at (e.g., in or on) the other side (e.g., in the +y direction) of the auxiliary display area ADA. The second data line DL2 is electrically connected to the second-first main pixel circuit PCm2-1 and the second-second main pixel circuit PCm2-2. The main pixels Pm arranged at (e.g., in or on) the main display area MDA, and belonging to the same column as that of the second-first main pixel Pm2-1 and the second-second main pixel Pm2-2, may be also be electrically connected to the second data line DL2.

The display apparatus 1 according to the present embodiment may be configured to apply data signals to the main pixels Pm belonging to the same column as each other, including the second-first main pixel Pm2-1 and the second-second main pixel Pm2-2, through the second data line DL2 electrically connected to the second-first main pixel Pm2-1 and the second-second main pixel Pm2-2. The second data line DL2 may not be electrically connected to a pixel arranged inside the auxiliary display area ADA.

As shown in FIG. 4, a third-first main pixel Pm3-1 and a third-second main pixel Pm3-2 may be arranged at (e.g., in or on) the main display area MDA. A column in which the third-first main pixel Pm3-1 and the third-second main pixel Pm3-2 are arranged may be different from the column in which the first-first main pixel Pm1-1 and the first-second main pixel Pm1-2 are arranged, and different from the column in which the second-first main pixel Pm2-1 and the second-second main pixel Pm2-2 are arranged. In more detail, the column in which the third-first main pixel Pm3-1 and the third-second main pixel Pm3-2 are arranged may be located between the column in which the first-first main pixel Pm1-1 and the first-second main pixel Pm1-2 are arranged and the column in which the second-first main pixel Pm2-1 and the second-second main pixel Pm2-2 are arranged.

The third-first main pixel Pm3-1 is arranged at (e.g., in or on) the first portion of the main display area MDA. The third-first main pixel Pm3-1 includes a third-first main pixel circuit PCm3-1, and a third-first main display element EDm3-1 electrically connected to the third-first main pixel circuit PCm3-1. In addition, the third-second main pixel Pm3-2 is arranged at (e.g., in or on) the second portion of the main display area MDA. The third-second main pixel Pm3-2 includes a third-second main pixel circuit PCm3-2, and a third-second main display element EDm3-2 electrically connected to the third-second main pixel circuit PCm3-2. The third-first main pixel element PCm3-1 may overlap with the third-first main display element EDm3-1, and the third-second main pixel circuit PCm3-2 may overlap with the third-second main display element EDm3-2. The third-first main pixel Pm3-1 may be arranged in the same column as that of the third-second main pixel Pm3-2.

A third-first data line DL3-1 is arranged at (e.g., in or on) the first portion of the main display area MDA, and extends in the first direction (e.g., the y-axis direction). The third-first data line DL3-1 is electrically connected to the third-first main pixel circuit PCm3-1. The main pixels Pm arranged at (e.g., in or on) the first portion of the main display area MDA, and belonging to the same column as that of the third-first main pixel Pm3-1, may be also be electrically connected to the third-first data line DL3-1. Similarly, a third-second data line DL3-2 extending in the first direction (e.g., the y-axis direction) is arranged at (e.g., in or on) the second portion of the main display area MDA to be arranged at (e.g., in or on) the other side (e.g., in the +y direction) of the auxiliary display area ADA. The third-second data line DL3-2 is electrically connected to the third-second main pixel circuit PCm3-2. In addition, the main pixels Pm arranged at (e.g., in or on) the second portion of the main display area MDA, and belonging to the same column as that of the third-second main pixel Pm3-2, may be electrically connected to the third-second data line DL3-2. An end of the third-second data line DL3-2 in a direction opposite a direction of the auxiliary display area ADA may extend to the peripheral area NDA outside the main display area MDA. The other data lines described above may also have an end that extends to the peripheral area NDA outside the main display area MDA.

The third-first data line DL3-1 is electrically connected to the third-second data line DL3-2. In more detail, the third-first data line DL3-1 is electrically connected to the third-second data line DL3-2 through a second horizontal connection line HCL2, a second vertical connection line VCL2, and a second peripheral connection line PCL2.

The second horizontal connection line HCL2 is arranged at (e.g., in or on) the first portion of the main display area MDA, and extends in the second direction (e.g., the x-axis direction). One end of the second horizontal connection line HCL2 is electrically connected to the third-first data line DL3-1. The second vertical connection line VCL2 is electrically connected to another end of the second horizontal connection line HCL2, and extends in the first direction (e.g., the y-axis direction) from the first portion of the main display area MDA into the second portion of the main display area MDA through the intermediate area MA. One end of the second peripheral connection line PCL2 is electrically connected to the second vertical connection line VCL2 at (e.g., in or on) the second portion of the main display area MDA, and extends approximately in the second direction (e.g., the x-axis direction). Another end of the second peripheral connection line PCL2 is electrically connected to the third-second data line DL3-2. At least a portion of the second peripheral connection line PCL2 may be arranged at (e.g., in or on) the peripheral area NDA outside the main display area MDA.

As described above, the display apparatus 1 according to the present embodiment may be configured to apply data signals to main pixels Pm belonging to the same column as each other, including the third-first main pixel Pm3-1 and the third-second main pixel Pm3-2, through the third-first data line DL3-1 and the third-second data line DL3-2 electrically connected to the third-first main pixel Pm3-1 and the third-second main pixel Pm3-2.

The first auxiliary pixel circuit PCa1 arranged at (e.g., in or on) the intermediate area MA is electrically connected to the second vertical connection line VCL2. As described above, the second vertical connection line VCL2 is electrically connected to the third-first data line DL3-1 through the second horizontal connection line HCL2. Thus, the display apparatus may be configured to apply data signals to the first auxiliary pixel circuit PCa1 arranged at (e.g., in or on) the intermediate area MA through the third-first data line DL3-1, the second horizontal connection line HCL2, and the second vertical connection line VCL2. Accordingly, the display apparatus 1 may be configured to control light-emission of the first auxiliary pixel Pa1, a light-emitting degree, and the like, the first auxiliary pixel Pa1 including the first auxiliary pixel circuit PCa1 and the first auxiliary display element EDa1. In other words, the second vertical connection line VCL2 may be configured to apply data signals to the first auxiliary pixel Pa1 including the first auxiliary pixel circuit PCa1 and the first auxiliary display element EDa1. As described above, in the display apparatus 1 according to the present embodiment, images may be effectively displayed not only in the first and second portions of the main display area MDA, but in the intermediate area MA as well.

As described above, the column in which the third-first main pixel Pm3-1 and the third-second main pixel Pm3-2 are arranged may be located between the column in which the first-first main pixel Pm1-1 and the first-second main pixel Pm1-2 are arranged and the column in which the second-first main pixel Pm2-1 and the second-second main pixel Pm2-2 are arranged. Thus, the third-first data line DL3-1 may be arranged between the first-first data line DL1-1 and the second data line DL2. Accordingly, when viewed in a direction (e.g., the z-axis direction) perpendicular to or substantially perpendicular to the upper surface of the substrate 100 (e.g., in a plan view), the second horizontal connection line HCL2 that is electrically connected to the third-first data line DL3-1 and extending in the second direction (e.g., the x-axis direction) may cross the second data line DL2. For example, the second horizontal connection line HCL2 may be disposed at (e.g., in or on) a layer different from a layer at (e.g., in or on) which the second data line DL2 is disposed.

Figure 5:
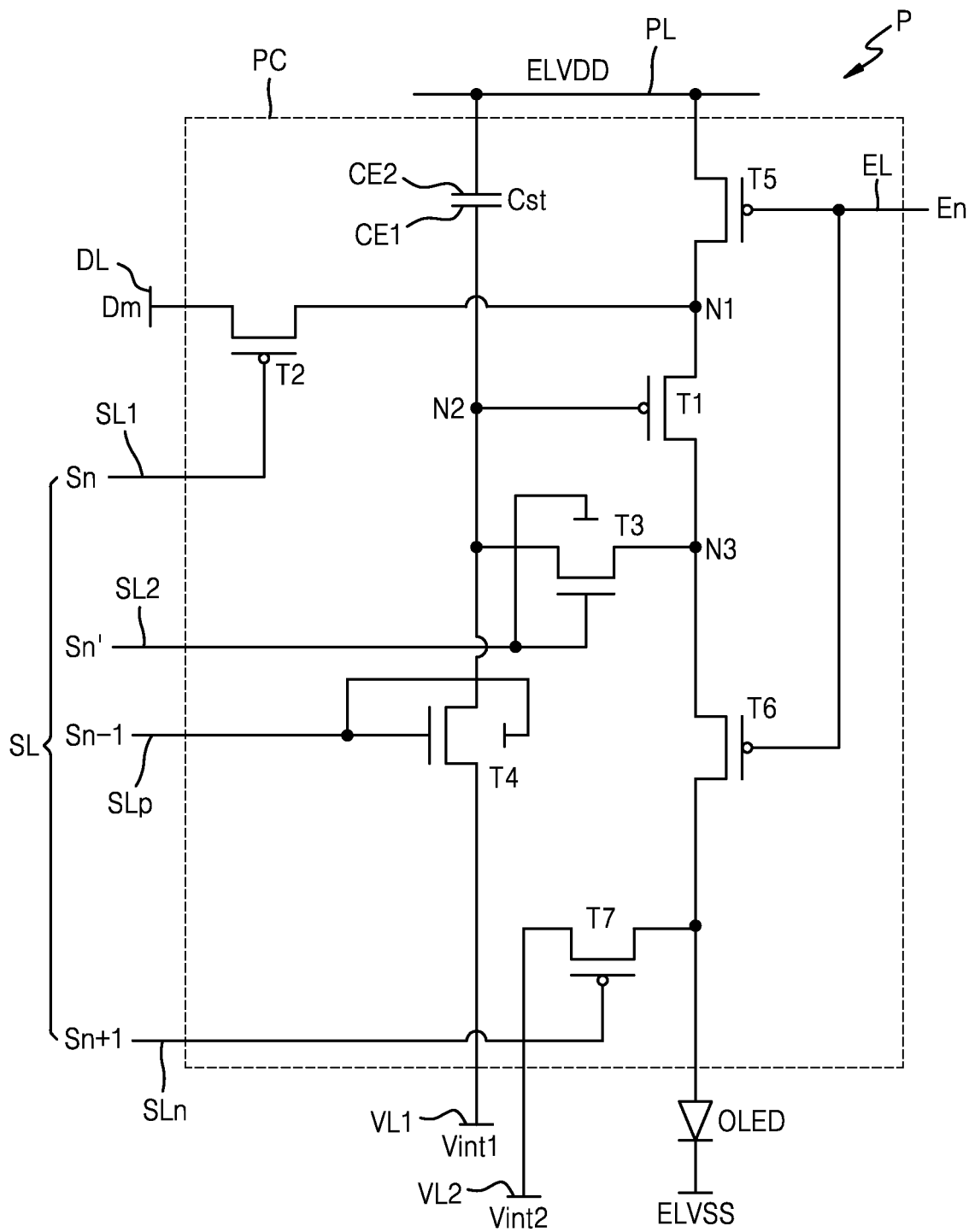
FIG. 5 is an equivalent circuit diagram of a pixel included in the display apparatus of FIG. 1.

FIG. 5 is an equivalent circuit diagram of a pixel P included in the display apparatus 1 of FIG. 1. Here, the pixel P may be the first-first main pixel Pm1-1, the first-second main pixel Pm1-2, the first auxiliary pixel Pa1, or the second auxiliary pixel Pa2.

As shown in FIG. 5, the pixel P may include a pixel circuit PC, and an organic light-emitting diode OLED electrically connected to the pixel circuit PC.

As shown in FIG. 5, the pixel circuit PC may include a plurality of thin-film transistors T1, T2, T3, T4, T5, T6, and T7, and a storage capacitor Cst. The plurality of thin-film transistors T1, T2, T3, T4, T5, T6, and T7 and the storage capacitor Cst may be connected to signal lines SL1, SL2, SLp, SLn, EL, and DL, a first initialization voltage line VL1, a second initialization voltage line VL2, and the driving voltage line PL. At least one of the lines or wirings, for example, such as the driving voltage line PL, may be shared by pixels P that are adjacent to each other.

The plurality of thin-film transistors T1, T2, T3, T4, T5, T6, and T7 may include a driving transistor T1, a switching transistor T2, a compensation transistor T3, a first initialization transistor T4, an operation control transistor T5, an emission control transistor T6, and a second initialization transistor T7.

The organic light-emitting diode OLED may include a pixel electrode and an opposite electrode. The pixel electrode of the organic light-emitting diode OLED may be connected to the driving transistor T1 through the emission control transistor T6 to receive a driving current. The opposite electrode may receive a common voltage ELVSS. The organic light-emitting diode OLED may emit light having a desired brightness corresponding to the driving current.

Some of the plurality of thin-film transistors T1, T2, T3, T4, T5, T6, and T7 may be n-channel metal-oxide semiconductor (NMOS) field-effect transistors (n-channel MOSFETs), and others may be p-channel metal-oxide semiconductor (PMOS) field-effect transistors (p-channel MOSFETs). As an example, from among the plurality of thin-film transistors T1, T2, T3, T4, T5, T6, and T7, the compensation transistor T3 and the first initialization transistor T4 may be n-channel MOSFETs (NMOS transistors), and the others (e.g., the rest) may be p-channel MOSFETs (PMOS transistors). As another example, from among the plurality of thin-film transistors T1, T2, T3, T4, T5, T6, and T7, the compensation transistor T3, the first initialization transistor T4, and the second initialization transistor T7 may be NMOS transistors, and the others may be PMOS transistors. As another example, all of the plurality of thin-film transistors T1, T2, T3, T4, T5, T6, and T7 may be NMOS transistors or PMOS transistors. The plurality of thin-film transistors T1, T2, T3, T4, T5, T6, and T7 may each include amorphous silicon or polycrystalline silicon. A thin-film transistor, for example, such as an NMOS transistor, may include an oxide semiconductor as needed or desired. Hereinafter, for convenience of description, a case where the compensation transistor T3 and the first initialization transistor T4 are NMOS transistors and the others are PMOS transistors is described in more detail.

The signal lines may include a first scan line SL1, a second scan line SL2, a previous scan line SLp, a next scan line SLn, an emission control line EL, and a data line DL. The first scan line SL1 is configured to transfer a first scan signal Sn, the second scan line SL2 is configured to transfer a second scan signal Sn', the previous scan line SLp is configured to transfer a previous scan signal Sn−1 to the first initialization transistor T4, and the next scan line SLn is configured to transfer a next scan signal Sn+1 to the second initialization transistor T7. The emission control line EL is configured to transfer an emission control signal En to the operation control transistor T5 and the emission control transistor T6, and the data line DL, which crosses the first scan line SL1, is configured to transfer a data signal Dm. Here, the data line DL may be one of the first-first data line DL1-1, the first-second data line DL1-2, the second data line DL2, the third-first data line DL3-1, or the third-second data line DL3-2 described above with reference to FIG. 4.

The driving voltage line PL may be configured to transfer the driving voltage ELVDD to the driving transistor T1, the first initialization voltage line VL1 may be configured to transfer a first initialization voltage Vint1 for initializing the driving transistor T1, and the second initialization voltage line VL2 may be configured to transfer a second initialization voltage Vint2 for initializing the first electrode (e.g., the pixel electrode) of the organic light-emitting diode OLED.

A driving gate electrode of the driving transistor T1 may be connected to the storage capacitor Cst through a second node N2. One of a source region or a drain region of the driving transistor T1 may be connected to the driving voltage line PL through the operation control transistor T5 via a first node N1, and the other of the source region or the drain region of the driving transistor T1 may be connected to the first electrode (e.g., the pixel electrode) of the organic light-emitting diode OLED through the emission control transistor T6 via a third node N3. The driving transistor T1 may be configured to receive a data signal Dm and supply the driving current to the organic light-emitting diode OLED according to a switching operation of the switching transistor T2. In other words, the driving transistor T1 may be configured to control an amount of the driving current flowing from the first node N1 that is electrically connected to the driving voltage line PL to the organic light-emitting diode OLED, in response to a voltage applied to the second node N2 and changed by the data signal Dm.

A switching gate electrode of the switching transistor T2 may be connected to the first scan line SL1 configured to transfer a first scan signal Sn. One of a source region or a drain region of the switching transistor T2 may be connected to the data line DL, and the other of the source region or the drain region of the switching transistor T2 may be connected to the driving transistor T1 through the first node N1 and connected to the driving voltage line PL through the operation control transistor T5. The switching transistor T2 may be configured to transfer the data signal Dm from the data line DL to the first node N1 in response to a voltage applied to the first scan line SL1. In other words, the switching transistor T2 may perform a switching operation to be turned on according to the first scan signal Sn transferred through the first scan line SL1, and may transfer the data signal Dm transferred through the data line DL to the driving transistor T1 through the first node N1.

A compensation gate electrode of the compensation transistor T3 is connected to the second scan line SL2. One of a source region or a drain region of the compensation transistor T3 may be connected to the first electrode (e.g., the pixel electrode) of the organic light-emitting diode OLED through the emission control transistor T6 via the third node N3. The other of the source region or the drain region of the compensation transistor T3 may be connected to a first capacitor electrode CE1 of the storage capacitor Cst and the driving gate electrode of the driving transistor T1 through the second node N2. The compensation transistor T3 may diode-connect the driving transistor T1 by being turned on according to a second scan signal Sn' received through the second scan line SL2.

A first initialization gate electrode of the first initialization transistor T4 may be connected to the previous scan line SLp. One of a source region or a drain region of the first initialization transistor T4 may be connected to the first initialization voltage line VL1. The other of the source region or the drain region of the first initialization transistor T4 may be connected to the first capacitor electrode CE1 of the storage capacitor Cst and the driving gate electrode of the driving transistor T1 through the second node N2. The first initialization transistor T4 may be configured to apply the first initialization voltage Vint1 from the first initialization voltage line VL1 to the second node N2 according to a voltage applied to the previous scan line SLp. In other words, the first initialization transistor T4 may be turned on according to a previous scan signal Sn−1 received through the previous scan line SLp, and may perform an initialization operation of initializing the voltage of the driving gate voltage of the driving transistor T1 by transferring the first initialization voltage Vint1 to the driving gate electrode of the driving transistor T1.

An operation control gate electrode of the operation control transistor T5 may be connected to the emission control line EL. One of a source region or a drain region of the operation control transistor T5 may be connected to the driving voltage line PL, and the other of the source region or the drain region of the operation control transistor T5 may be connected to the driving transistor T1 and the switching transistor T2 through the first node N1.

An emission control gate electrode of the emission control transistor T6 may be connected to the emission control line EL. One of a source region or a drain region of the emission control transistor T6 may be connected to the driving transistor T1 and the compensation transistor T3 through the third node N3, and the other of the source region or the drain region of the emission control transistor T6 may be electrically connected to the first electrode (e.g., the pixel electrode) of the organic light-emitting diode OLED.

The operation control transistor T5 and the emission control transistor T6 may be concurrently (e.g., simultaneously) turned on according to an emission control signal En transferred through the emission control line EL, such that the driving voltage ELVDD is transferred to the organic light-emitting diode OLED, and the driving current flows through the organic light-emitting diode OLED.

A second initialization gate electrode of the second initialization transistor T7 may be connected to the next scan line SLn. One of a source region or a drain region of the second initialization transistor T7 may be connected to the first electrode (e.g., the pixel electrode) of the organic light-emitting diode OLED, and the other of the source region or the drain region of the second initialization transistor T7 may be electrically connected to the second initialization voltage line VL2 to receive the second initialization voltage Vint2. The second initialization transistor T7 is turned on according to a next scan signal Sn+1 transferred through the next scan line SLn, and initializes the first electrode (e.g., the pixel electrode) of the organic light-emitting diode OLED. In some embodiments, the next scan line SLn may be the same line as that of the first scan line SL1. In this case, the relevant scan line may be configured to transfer the same electric signals with a time difference, and thus, may serve as the first scan line SL1 and the next scan line SLn. In other words, the next scan line SLn may be a first scan line of another pixel circuit that is adjacent to the pixel circuit PC shown in FIG. 5 and electrically connected to the same data line DL.

As shown in FIG. 5, the second initialization transistor T7 may be connected to the next scan line SLn (or the first scan line SL1). However, the present disclosure is not limited thereto, and the second initialization transistor T7 may be connected to the emission control line EL and driven according to an emission control signal En.

The storage capacitor Cst may include the first capacitor electrode CE1 and a second capacitor electrode CE2. The first capacitor electrode CE1 of the storage capacitor Cst is connected to the driving gate electrode of the driving transistor T1 through the second node N2, and the second capacitor electrode CE2 of the storage capacitor Cst is connected to the driving voltage line PL. The storage capacitor Cst may store a charge corresponding to a difference between a voltage of the driving gate electrode of the driving transistor T1 and the driving voltage ELVDD.

An operation of each pixel P according to an embodiment is described in more detail below.

For an initialization period, when a previous scan signal Sn−1 is supplied through the previous scan line SLp, the first initialization transistor T4 is turned on according to the previous scan signal Sn−1, and the driving transistor T1 is initialized by the first initialization voltage Vint1 supplied from the first initialization voltage line VL1.

For a data programming period, when a first scan signal Sn and a second scan signal Sn' are supplied through the first scan line SL1 and the second scan line SL2, the switching transistor T2 and the compensation transistor T3 are turned on according to the first scan signal Sn and the second scan signal Sn'. In this case, the driving transistor T1 is diode-connected and forward-biased by the turned-on compensation transistor T3. A compensation voltage Dm+Vth (where Vth has a (−) value) is applied to the driving gate electrode of the driving transistor T1. The compensation voltage Dm+Vth may be a voltage that is reduced by a threshold voltage Vth of the driving transistor T1 from a data signal Dm supplied through the data line DL. The driving voltage ELVDD and the compensation voltage Dm+Vth are applied to two opposite ends of the storage capacitor Cst. A charge corresponding to a voltage difference between the two opposite ends of the storage capacitor Cst is stored in the storage capacitor Cst.

For an emission period, the operation control transistor T5 and the emission control transistor T6 are turned on according to an emission control signal En supplied through the emission control line EL. The driving current corresponding to a voltage difference between a voltage of the driving gate electrode of the driving transistor T1 and the driving voltage ELVDD is generated. The driving current is supplied to the organic light-emitting diode OLED through the emission control transistor T6.

As described above, some of the plurality of thin-film transistors T1, T2, T3, T4, T5, T6, and T7 may include an oxide semiconductor. As an example, the compensation transistor T3 and the first initialization transistor T4 may each include an oxide semiconductor.

Because polycrystalline silicon has high reliability, an accurately intended current may be controlled to flow. Accordingly, the driving transistor T1, which may directly influence the brightness of the display apparatus 1, may include a semiconductor layer including polycrystalline silicon having high reliability, and thus, a display apparatus having a high resolution may be implemented. Because an oxide semiconductor has high carrier mobility and low leakage current, a voltage drop may not be large even when a driving time is long. In other words, because, in case of an oxide semiconductor, a color change of an image due to a voltage drop is not large even when a display apparatus 1 is driven at low frequencies, the display apparatus 1 may be driven at low frequencies. Accordingly, because the compensation transistor T3 and the first initialization transistor T4 may each include an oxide semiconductor, a display apparatus 1 that may prevent or substantially prevent a leakage current from occurring, while having reduced power consumption, may be implemented.

The oxide semiconductor is sensitive to light, and thus, a change in the amount of current and the like may occur due to external light. Accordingly, a metal layer may be arranged below the oxide semiconductor to absorb or reflect the external light. Accordingly, as shown in FIG. 5, gate electrodes of the compensation transistor T3 and the first initialization transistor T4, which may each include an oxide semiconductor, may be respectively arranged above and below the oxide semiconductor layer. In other words, in a plan view (e.g., when viewed in a direction (e.g., a z-axis direction) perpendicular to or substantially perpendicular to the upper surface of the substrate 100), a metal layer arranged below the oxide semiconductor may overlap with the oxide semiconductor.

Figure 6:
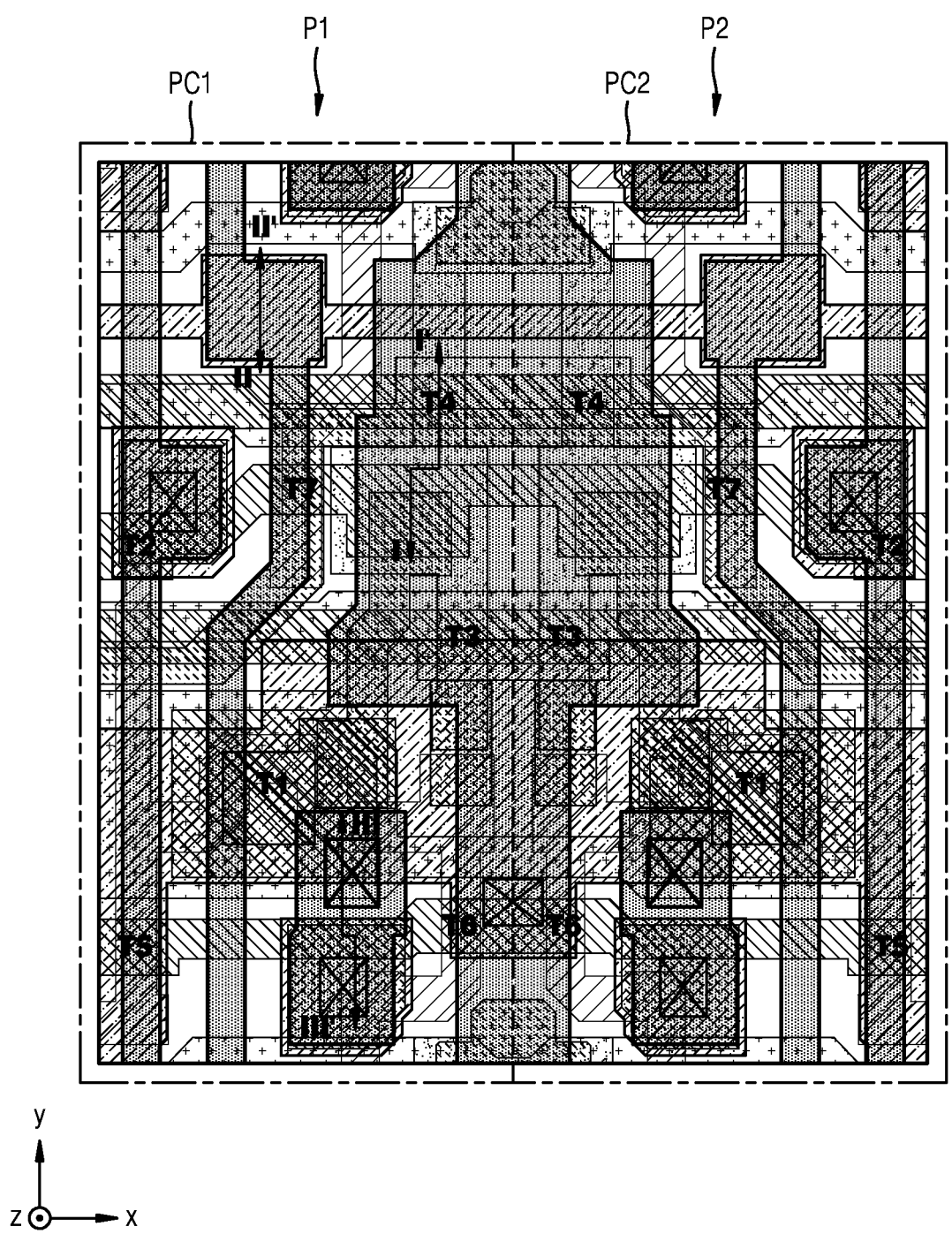
FIG. 6 is an arrangement view of positions of transistors and capacitors in pixels included in the display apparatus of FIG. 1.
Figure 14:
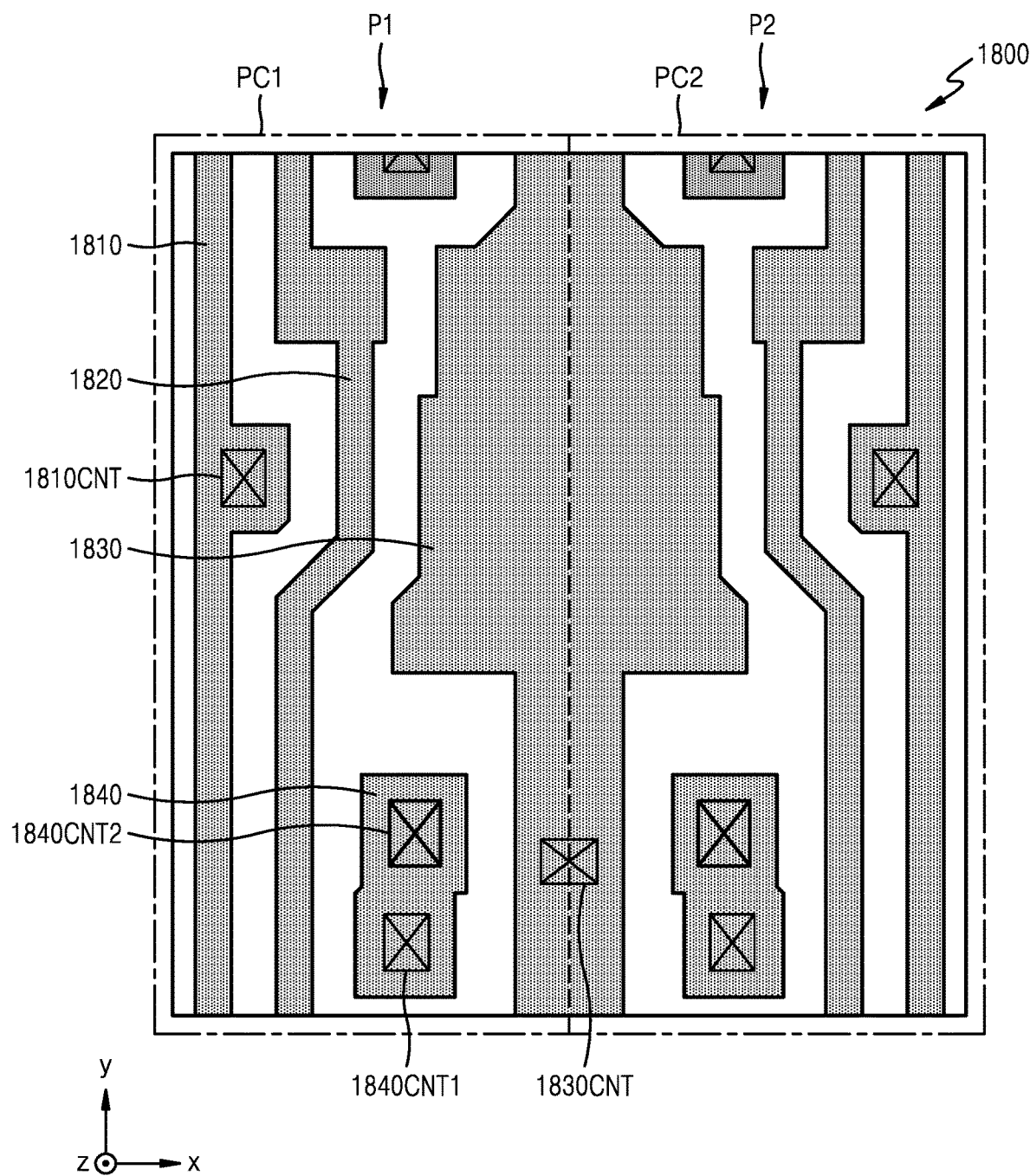
Figure 15:
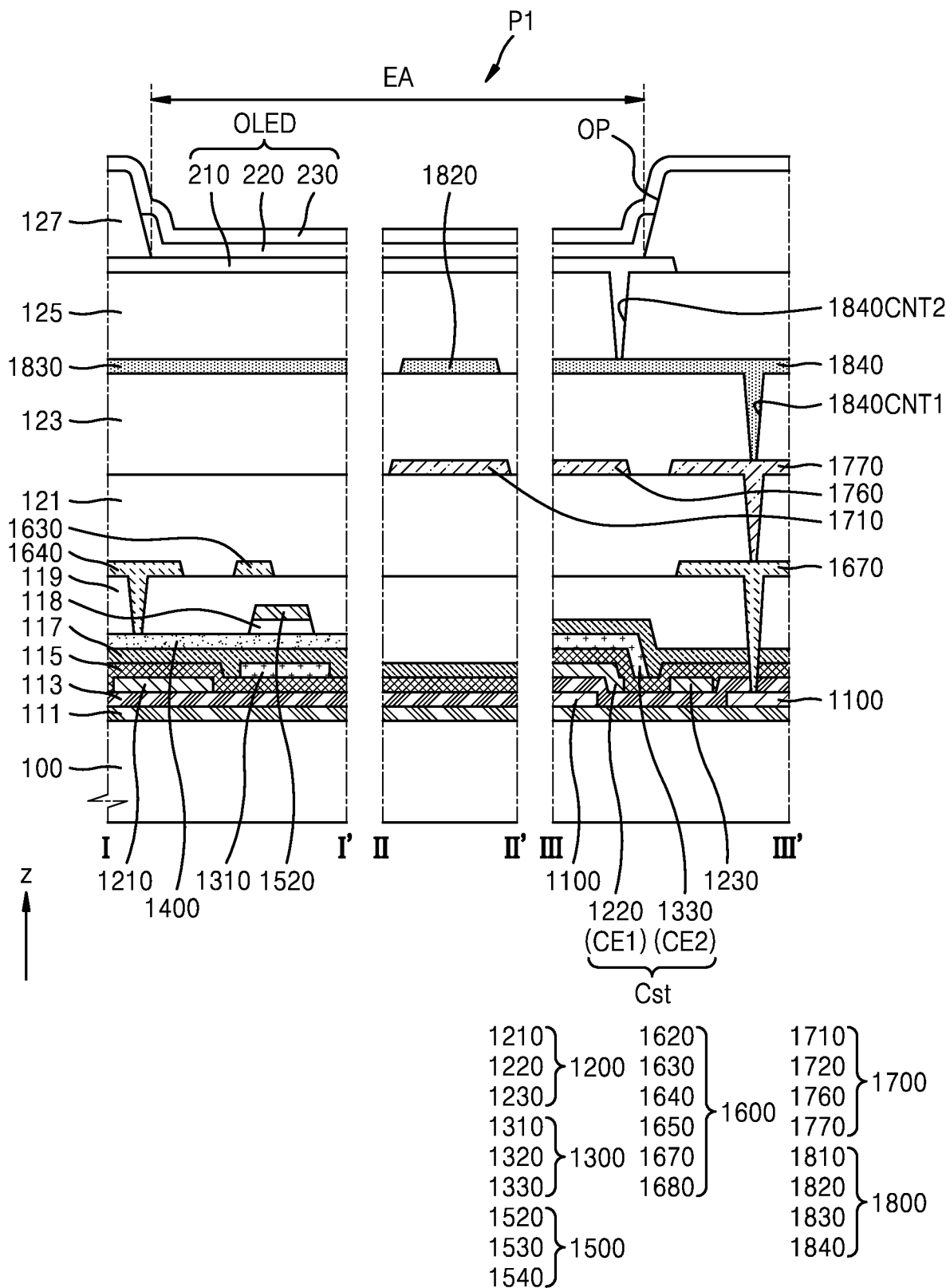
FIG. 15 is a cross-sectional view of the display apparatus taken along the lines I-I', II-II', and III-III' shown in FIG. 6.

FIG. 6 is an arrangement view of positions of transistors and capacitors in pixels included in the display apparatus 1 of FIG. 1. FIGS. 7 to 14 are arrangement views of various elements including transistors and capacitors for various layers of the display apparatus 1 shown in FIG. 6. FIG. 15 is a cross-sectional view of the display apparatus 1 taken along the lines I-I', II-II', and III-III' shown in FIG. 6.

As shown in the figures, the display apparatus 1 may include a first pixel P1 and a second pixel P2 that are adjacent to each other. As shown in FIG. 6, the first pixel P1 and the second pixel P2 may be symmetric or substantially symmetric with each other with respect to a virtual line. However, the present disclosure is not limited thereto, and the first pixel P1 and the second pixel P2 may have the same or substantially the same structure as each other instead, of a symmetric or substantially symmetric structure. The first pixel P1 may include a first pixel circuit PC1, and the second pixel P2 may include a second pixel circuit PC2. Hereinafter, for convenience of description, though some conductive patterns are described in more detail based on the first pixel circuit PC1, the conductive patterns may be symmetrically or substantially symmetrically arranged with respect to the second pixel circuit PC2.

A buffer layer 111 (e.g., see FIG. 15) may be arranged on the substrate 100. The buffer layer 111 may include silicon oxide, silicon nitride, or silicon oxynitride. The buffer layer 111 may prevent or substantially prevent metal atoms, impurities, and/or the like from diffusing to a first semiconductor layer 1100 located thereon from the substrate 100. In addition, the buffer layer 111 may allow the first semiconductor layer 1100 to be uniformly or substantially uniformly crystallized by adjusting a heat-providing speed during a crystallizing process of forming the first semiconductor layer 1100.

Figure 7:
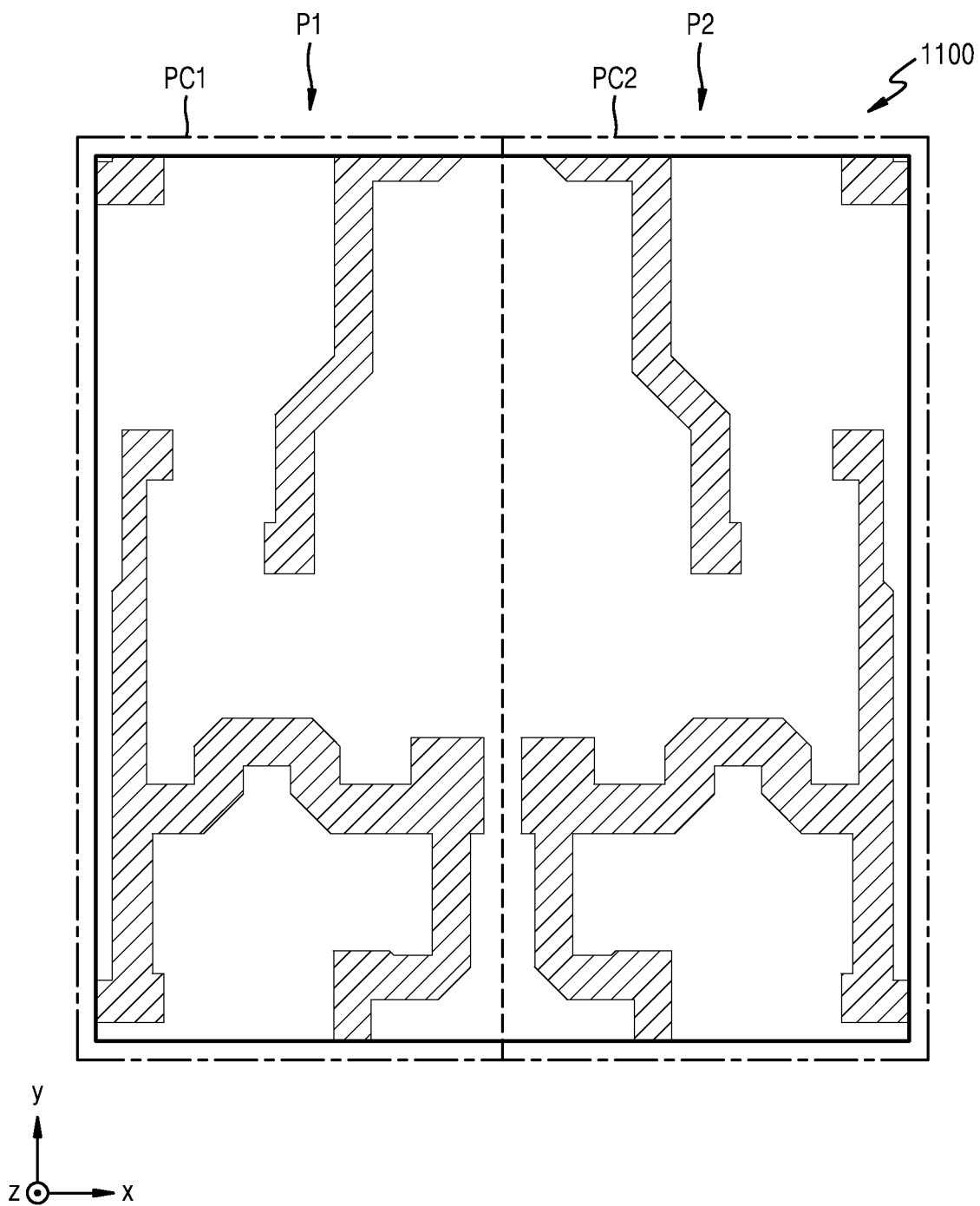
FIGS. 7-14 are arrangement views of various elements including transistors and capacitors for various layers of the display apparatus shown in FIG. 6.

As shown in FIG. 7, the first semiconductor layer 1100 may be arranged on the buffer layer 111. The first semiconductor layer 1100 may include a silicon semiconductor. As an example, the first semiconductor layer 1100 may include amorphous silicon or polycrystalline silicon. For example, the first semiconductor layer 1100 may include polycrystalline silicon that is crystallized at low temperature. Ions may be implanted to at least a portion of the first semiconductor layer 1100 when needed or desired.

Because the driving transistor T1, the switching transistor T2, the operation control transistor T5, the emission control transistor T6, and the second initialization transistor T7 may be PMOS transistors as described above, in this case, these thin-film transistors may be arranged along the first semiconductor layer 1100 as shown in FIG. 7.

A first gate insulating layer 113 (e.g., see FIG. 15) may cover the first semiconductor layer 1100, and may be arranged over the substrate 100. The first gate insulating layer 113 may include an insulating material. As an example, the first gate insulating layer 113 may include silicon oxide, silicon nitride, silicon oxynitride, aluminum oxide, or the like.

Figure 8:
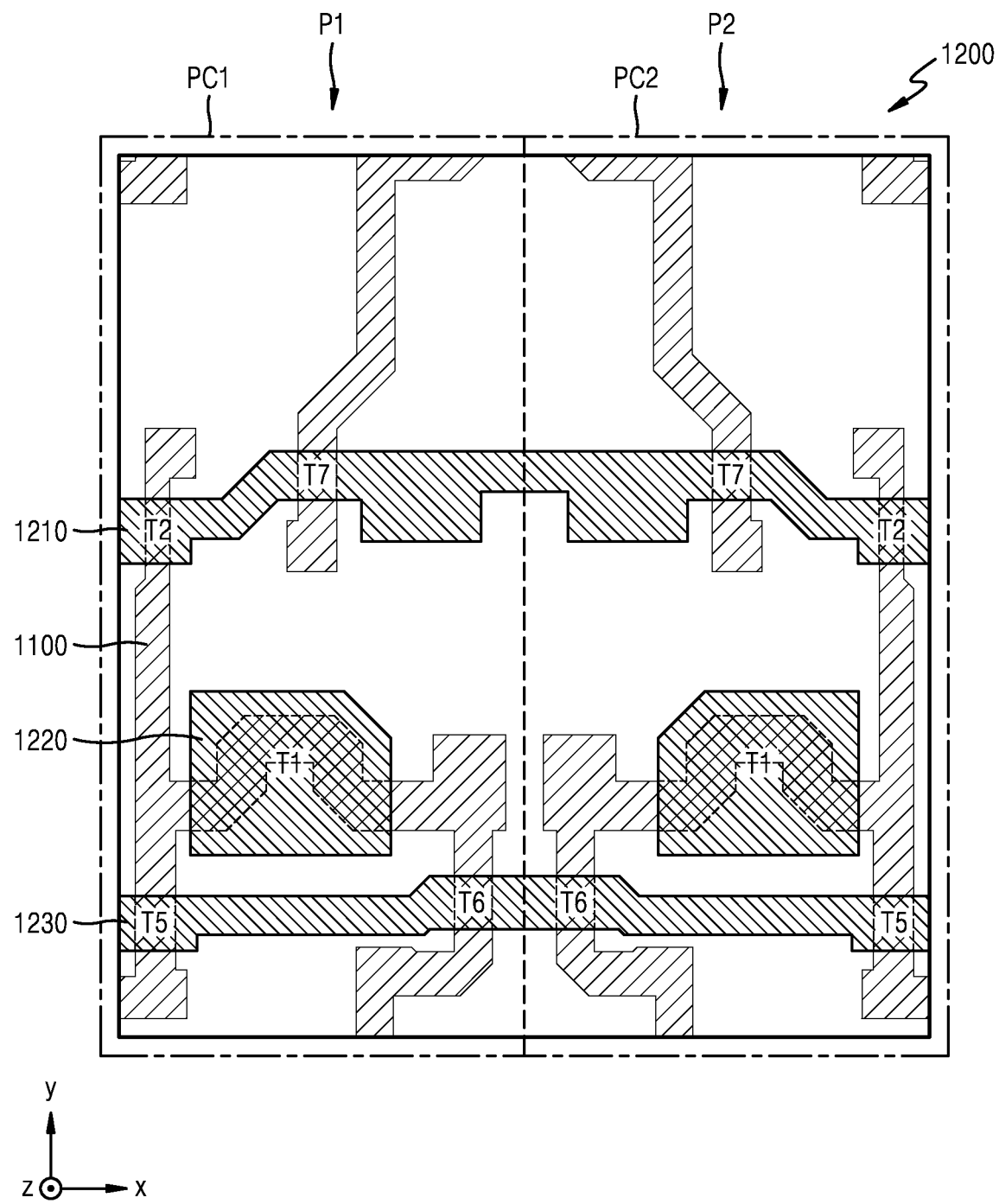
Figure 9:
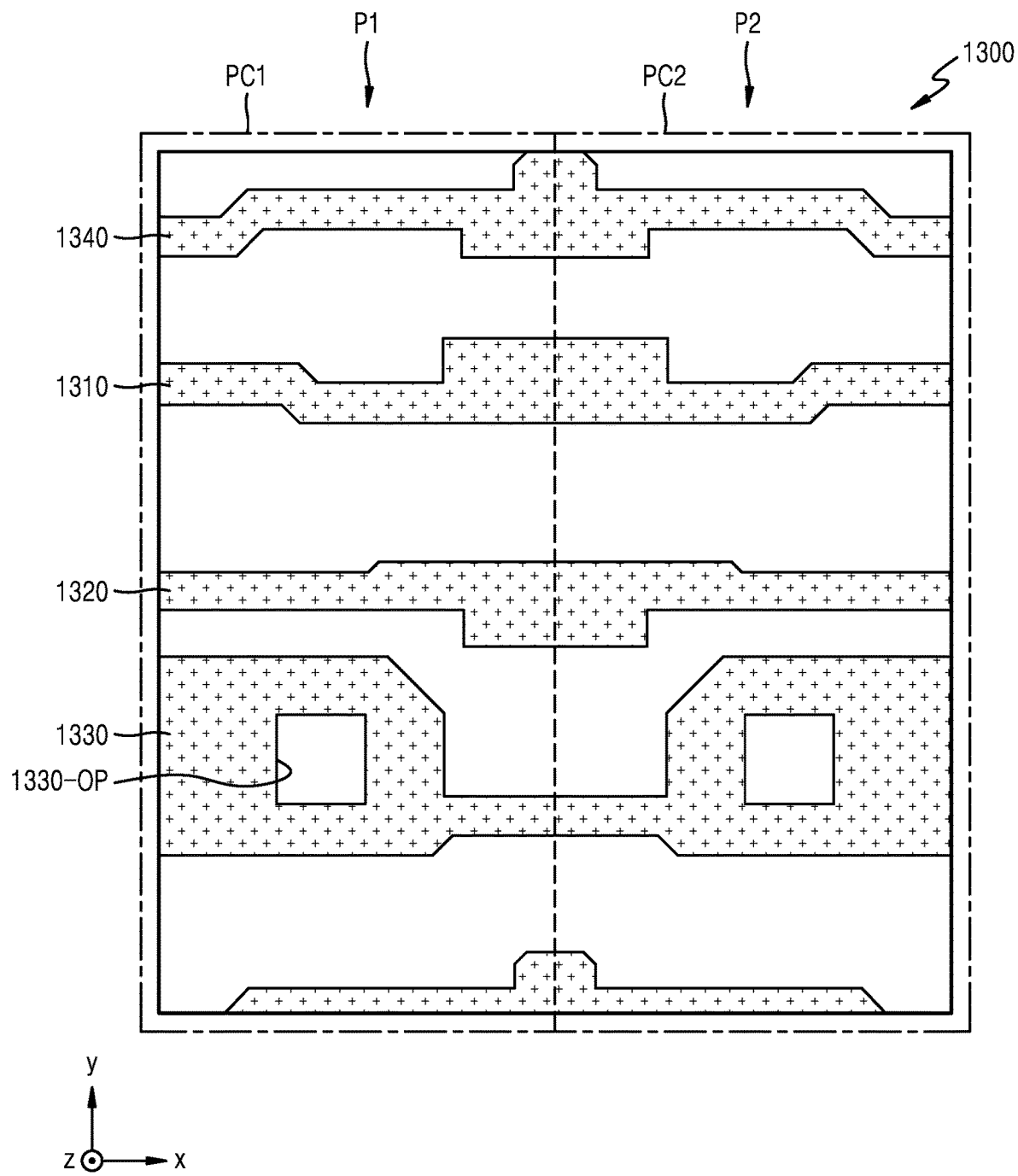

As shown in FIG. 8, a first gate layer 1200 may be arranged on the first gate insulating layer 113. For convenience of illustration, FIG. 8 shows the first gate layer 1200 together with the first semiconductor layer 1100. The first gate layer 1200 may include a first gate line 1210, a first gate electrode 1220, and a second gate line 1230.

The first gate line 1210 may extend in the second direction (e.g., the x-axis direction). The first gate line 1210 may be the first scan line SL1 or the next scan line SLn shown in FIG. 5. In other words, for the first pixel P1 shown in FIG. 8, the first gate line 1210 may correspond to the first scan line SL1 of FIG. 5. For a pixel adjacent to the first pixel P1 (e.g., in the +y direction), the first gate line 1210 may correspond to the next scan line SLn of FIG. 5. Accordingly, a first scan signal Sn and a next scan signal Sn+1 may be applied to the respective pixels through the first gate line 1210. Portions of the first gate line 1210 overlapping with the first semiconductor layer 1100 may be the switching gate electrode of the switching transistor T2 and the second initialization gate electrode of the second initialization transistor T7.

The first gate electrode 1220 may have an isolated shape. The first gate electrode 1220 is the driving gate electrode of the driving transistor T1. A portion of the first semiconductor layer 1100 overlapping with the first gate electrode 1220 and a portion in the vicinity thereof may be a driving semiconductor layer.

The second gate line 1230 may extend in the second direction (e.g., the x-axis direction). The second gate line 1230 may correspond to the emission control line EL shown in FIG. 5. Portions of the second gate line 1230 overlapping with the first semiconductor layer 1100 may be the operation control gate electrode of the operation control transistor T5 and the emission control gate electrode of the emission control transistor T6. An emission control signal En may be applied to the pixels through the second gate line 1230.

The first gate layer 1200 may include a metal, an alloy, a conductive metal oxide, or a transparent conductive material. As an example, the first gate layer 1200 may include silver (Ag), an alloy containing silver (Ag), molybdenum (Mo), an alloy containing molybdenum (Mo), aluminum (Al), an alloy containing aluminum (Al), aluminum nitride (AlN), tungsten (W), tungsten nitride (WN), copper (Cu), nickel (Ni), chrome (Cr), chrome nitride (CrN), titanium (Ti), tantalum (Ta), platinum (Pt), scandium (Sc), indium tin oxide (ITO), or indium zinc oxide (IZO). The first gate layer 1200 may have a multi-layered structure, for example, such as a two-layered structure of Mo/Al, or a three-layered structure of Mo/Al/Mo.

The second gate insulating layer 115 (e.g., see FIG. 15) may cover the first gate layer 1200, and may be arranged on the first gate insulating layer 113. The second gate insulating layer 115 may include the same or substantially the same material (or a similar material) as that of the first gate insulating layer 113.

A second gate layer 1300 (e.g., see FIG. 9) may be arranged on the second gate insulating layer 115. The second gate layer 1300 may include a third gate line 1310, a fourth gate line 1320, a capacitor upper electrode 1330, and a first initialization voltage line 1340 (e.g., the first initialization voltage line VL1).

The third gate line 1310 may extend in the second direction (e.g., the x-axis direction). The third gate line 1310 may correspond to the previous scan line SLp show in FIG. 5. In a plan view (e.g., when viewed in a direction (e.g., the z-axis direction) perpendicular to or substantially perpendicular to the substrate 100), the third gate line 1310 may be spaced apart from the first gate line 1210. A previous scan signal Sn−1 may be applied to the pixels through the third gate line 1310. A portion of the third gate line 1310 overlapping with a second semiconductor layer 1400 may be a first initialization lower gate electrode of the first initialization transistor T4.

The fourth gate line 1320 may extend in the second direction (e.g., the x-axis direction). The fourth gate line 1320 may correspond to the second scan line SL2 shown in FIG. 5. In a plan view (e.g., when viewed in a direction (e.g., the z-axis direction) perpendicular to or substantially perpendicular to the substrate 100), the fourth gate line 1320 may be spaced apart from the first gate line 1210 and the third gate line 1310. A second scan signal Sn' may be applied to the pixels through the fourth gate line 1320. A portion of the fourth gate line 1320 overlapping with the second semiconductor layer 1400 may be a compensation lower gate electrode of the compensation transistor T3.

The third gate line 1310 and the fourth gate line 1320 may be arranged under (e.g., underneath) the second semiconductor layer 1400 described in more detail below with reference to FIG. 10 to serve as not only gate electrodes, but also as lower protection metals for protecting portions of the second semiconductor layer 1400 overlapping with the third gate line 1310 and the fourth gate line 1320.

The capacitor upper electrode 1330 may overlap with the first gate electrode 1220, and may extend in the second direction (e.g., the x-axis direction). The capacitor upper electrode 1330 may correspond to the second capacitor electrode CE2 of FIG. 5, and may constitute the storage capacitor Cst in cooperation with the first gate electrode

1220. The driving voltage ELVDD may be applied to the capacitor upper electrode 1330. Also, a hole may be formed in the capacitor upper electrode 1330 to pass through (e.g., to penetrate) the capacitor upper electrode 1330. At least a portion of the first gate electrode 1220 may overlap with the hole.

The first initialization voltage line 1340 corresponding to the first initialization voltage line VL1 shown in FIG. 5 may extend in the second direction (e.g., the x-axis direction). In a plan view (e.g., when viewed in a direction (e.g., the z-axis direction) perpendicular to or substantially perpendicular to the substrate 100), the first initialization voltage line 1340 may be spaced apart from the third gate line 1310. The first initialization voltage Vint1 may be applied to the pixels through the first initialization voltage line 1340. The first initialization voltage line 1340 may overlap with at least a portion of the second semiconductor layer 1400 described in more detail below, and may be configured to transfer the first initialization voltage Vint1 to the second semiconductor layer 1400. The first initialization voltage line 1340 may be electrically connected to the second semiconductor layer 1400 through contact holes 1680CNT1, 1680CNT2, and 1680CNT3, which are described in more detail below with reference to FIG. 12.

The second gate layer 1300 may include a metal, an alloy, a conductive metal oxide, or a transparent conductive material. As an example, the second gate layer 1300 may include silver (Ag), an alloy containing silver (Ag), molybdenum (Mo), an alloy containing molybdenum (Mo), aluminum (Al), an alloy containing aluminum (Al), aluminum nitride (AlN), tungsten (W), tungsten nitride (WN), copper (Cu), nickel (Ni), chrome (Cr), chrome nitride (CrN), titanium (Ti), tantalum (Ta), platinum (Pt), scandium (Sc), indium tin oxide (ITO), or indium zinc oxide (IZO). The second gate layer 1300 may have a multi-layered structure, for example, such as a two-layered structure of Mo/Al, or a three-layered structure of Mo/Al/Mo.

A first interlayer insulating layer 117 (see FIG. 15) may cover the second gate layer 1300, and may be arranged on the second gate insulating layer 115. The first interlayer insulating layer 117 may include an insulating material. As an example, the first interlayer insulating layer 117 may include silicon oxide, silicon nitride, silicon oxynitride, aluminum oxide, or the like.

Figure 10:
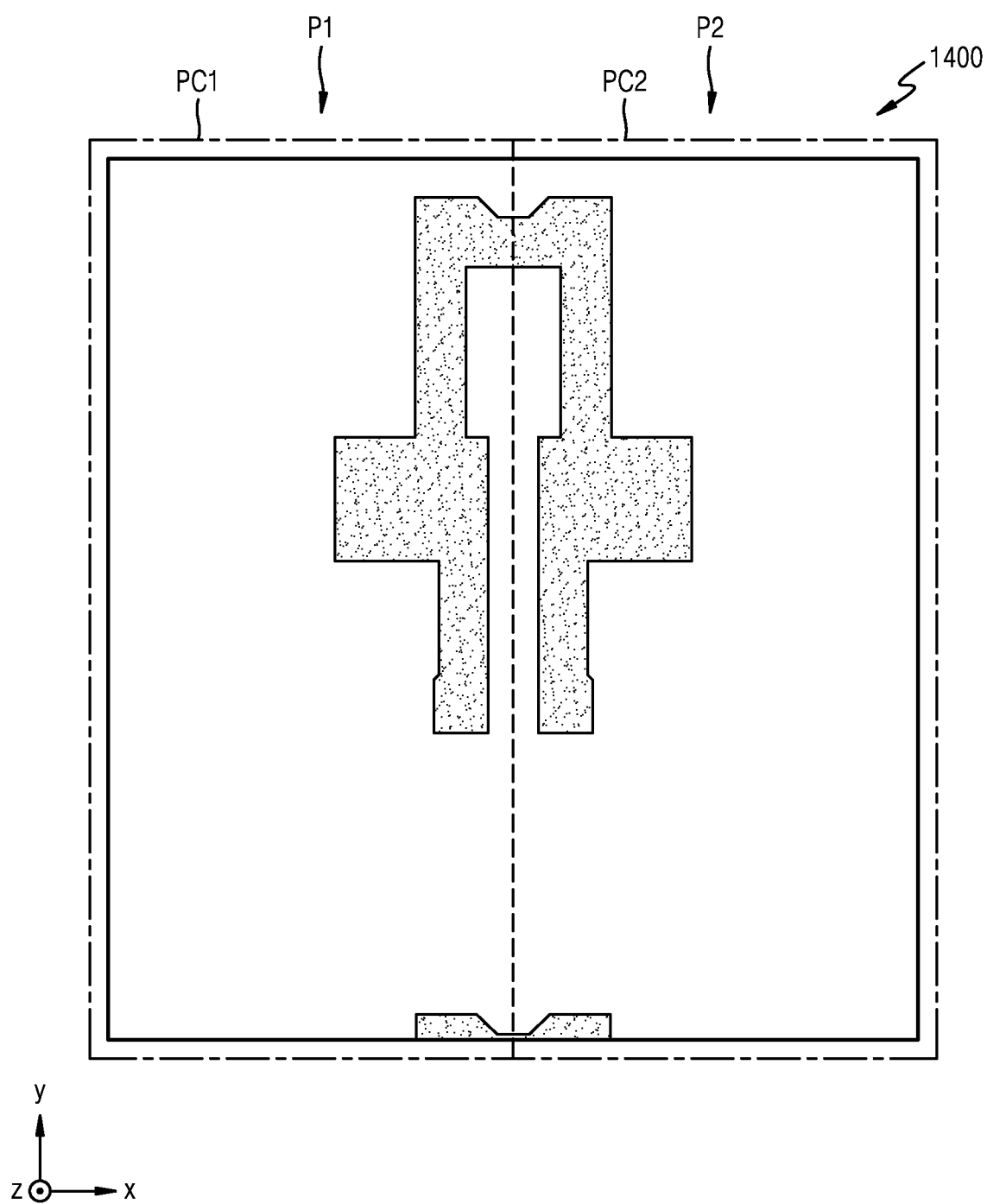

As shown in FIG. 10, the second semiconductor layer 1400 may be arranged on the first interlayer insulating layer 117. As described above, the second semiconductor layer 1400 may include an oxide semiconductor. The second semiconductor layer 1400 may be arranged at (e.g., in or on) a layer different from that of the first semiconductor layer 1100, and in a plan view (e.g., when viewed in a direction (e.g., the z-axis direction) perpendicular to or substantially perpendicular to the substrate 100), the second semiconductor layer 1400 may not overlap with the first semiconductor layer 1100.

A third gate insulating layer 118 (e.g., see FIG. 15) may cover the second semiconductor layer 1400, and may be arranged over the first interlayer insulating layer 117. The third gate insulating layer 118 may include an insulating material. As shown in FIG. 15, the third gate insulating layer 118 may be arranged on a portion (e.g., on only a portion) of the second semiconductor layer 1400, and may not be directly arranged on the first interlayer insulating layer 117. As shown in FIG. 15, the third gate insulating layer 118 may have the same or substantially the same pattern as that of a third gate layer 1500 described in more detail below with reference to FIG. 11. In other words, in a plan view (e.g., when viewed in a direction (e.g., the z-axis direction) perpendicular to or substantially perpendicular to the substrate 100), the third gate insulating layer 118 may completely or substantially (e.g., nearly completely) overlap with the third gate layer 1500. For example, the third gate insulating layer 118 and the third gate layer 1500 may be concurrently (e.g., simultaneously) patterned with each other. Accordingly, source regions and drain regions of the second semiconductor layer 1400, except channel regions, may not be covered by the third gate insulating layer 118, and the channel regions may overlap with the third gate layer 1500. The source regions and the drain regions may directly contact a second interlayer insulating layer 119 as shown in FIG. 15. The third gate insulating layer 118 may include silicon oxide, silicon nitride, silicon oxynitride, aluminum oxide, or the like.

Figure 11:
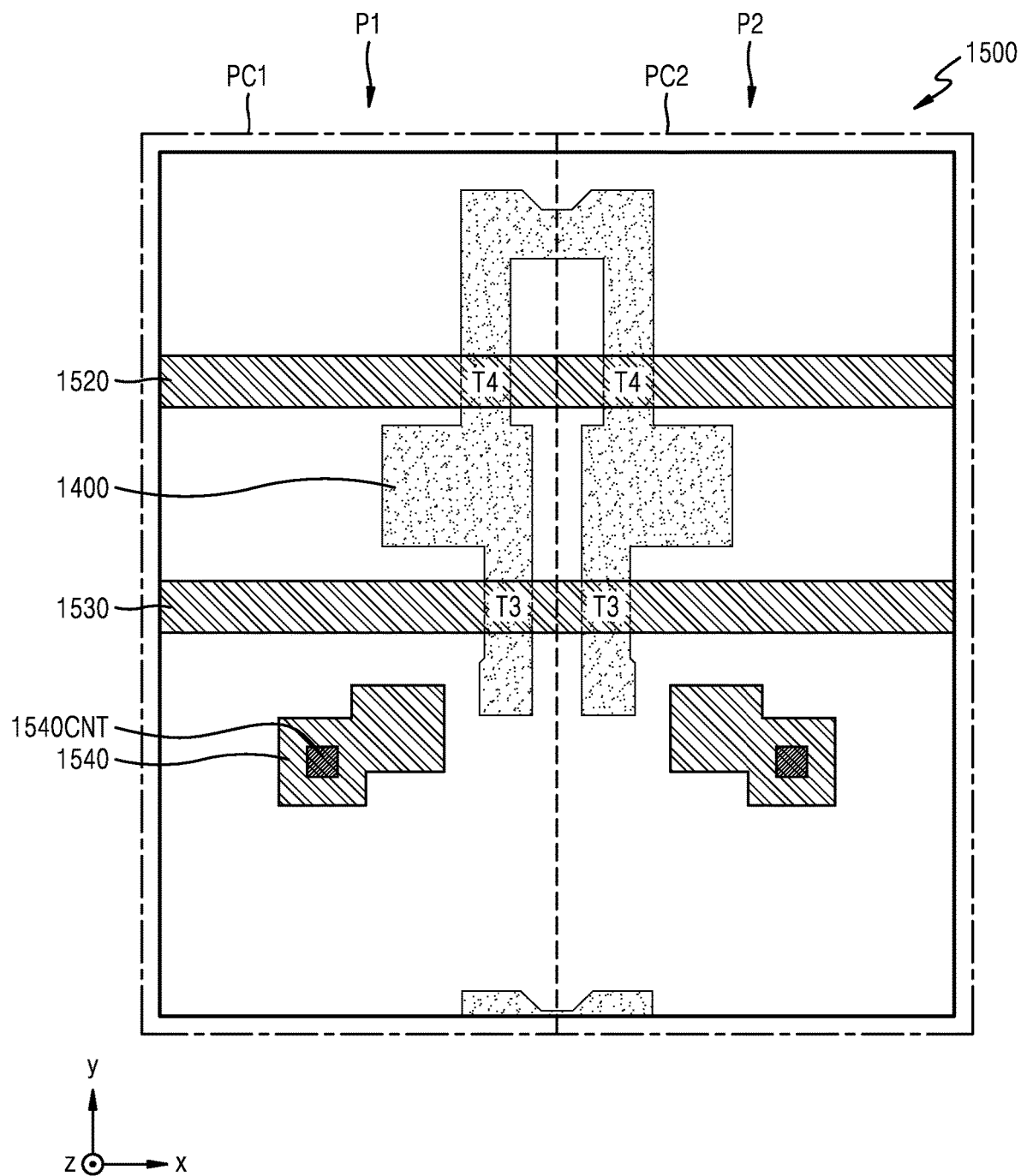

As shown in FIG. 11, the third gate layer 1500 may be arranged on the third gate insulating layer 118. The third gate layer 1500 may include a fifth gate line 1520, a sixth gate line 1530, and a first transfer line 1540.

The fifth gate line 1520 may extend in the second direction (e.g., the x-axis direction). In a plan view (e.g., when viewed in a direction (e.g., the z-axis direction) perpendicular to or substantially perpendicular to the substrate 100), the fifth gate line 1520 may overlap with the third gate line 1310. A portion of the fifth gate line 1520 overlapping with the second semiconductor layer 1400 may be a first initialization upper gate electrode of the first initialization transistor T4. A portion of the second semiconductor layer 1400 overlapping with the fifth gate line 1520 and a portion in the vicinity thereof may be a first initialization semiconductor layer. The fifth gate line 1520 may be electrically connected to the third gate line 1310. As an example, the fifth gate line 1520 may be electrically connected to the third gate line 1310 through a contact hole formed in an insulating layer between the fifth gate line 1520 and the third gate line 1310. The contact hole may be formed inside the display area DA or the peripheral area PA. Accordingly, the fifth gate line 1520 may correspond to the previous scan line SLp shown in FIG. 5 together with the third gate line 1310. Accordingly, a previous scan signal Sn−1 may be applied to the pixels through the fifth gate line 1520 and/or the third gate line 1310.

The sixth gate line 1530 may extend in the second direction (e.g., the x-axis direction). In a plan view (e.g., when viewed in a direction (e.g., the z-axis direction) perpendicular to or substantially perpendicular to the substrate 100), the sixth gate line 1530 may overlap with the fourth gate line 1320. A portion of the sixth gate line 1530 overlapping with the second semiconductor layer 1400 may be a compensation upper gate electrode of the compensation transistor T3. The sixth gate line 1530 may be electrically connected to the fourth gate line 1320. As an example, the sixth gate line 1530 may be electrically connected to the fourth gate line 1320 through a contact hole formed in an insulating layer between the sixth gate line 1530 and the fourth gate line 1320. The contact hole may be formed inside the display area DA or the peripheral area PA. Accordingly, the sixth gate line 1530 may correspond to the second scan line SL2 shown in FIG. 5 together with the fourth gate line 1320. Accordingly, a second scan signal Sn' may be applied to the pixels through the sixth gate line 1530 and/or the fourth gate line 1320.

The first transfer line 1540 may be electrically connected to the first gate electrode 1220, which is the driving gate electrode, through a contact hole 1540CNT passing through an opening 1330-OP of the capacitor upper electrode 1330.

The first transfer line 1540 may be configured to transfer the first initialization voltage Vint1 to the first gate electrode 1220, the first initialization voltage Vint1 being transferred through the first initialization transistor T4.

The third gate layer 1500 may include a metal, an alloy, a conductive metal oxide, or a transparent conductive material. As an example, the third gate layer 1500 may include silver (Ag), an alloy containing silver (Ag), molybdenum (Mo), an alloy containing molybdenum (Mo), aluminum (Al), an alloy containing aluminum (Al), aluminum nitride (AlN), tungsten (W), tungsten nitride (WN), copper (Cu), nickel (Ni), chrome (Cr), chrome nitride (CrN), titanium (Ti), tantalum (Ta), platinum (Pt), scandium (Sc), indium tin oxide (ITO), or indium zinc oxide (IZO). The third gate layer 1500 may have a multi-layered structure, for example, such as a two-layered structure of Mo/Al, or a three-layered structure of Mo/Al/Mo.

The second interlayer insulating layer 119 (e.g., see FIG. 15) may cover at least a portion of the third gate layer 1500 of FIG. 11. The second interlayer insulating layer 119 may include an insulating material. As an example, the second interlayer insulating layer 119 may include silicon oxide, silicon nitride, silicon oxynitride, aluminum oxide, or the like.

Figure 12:
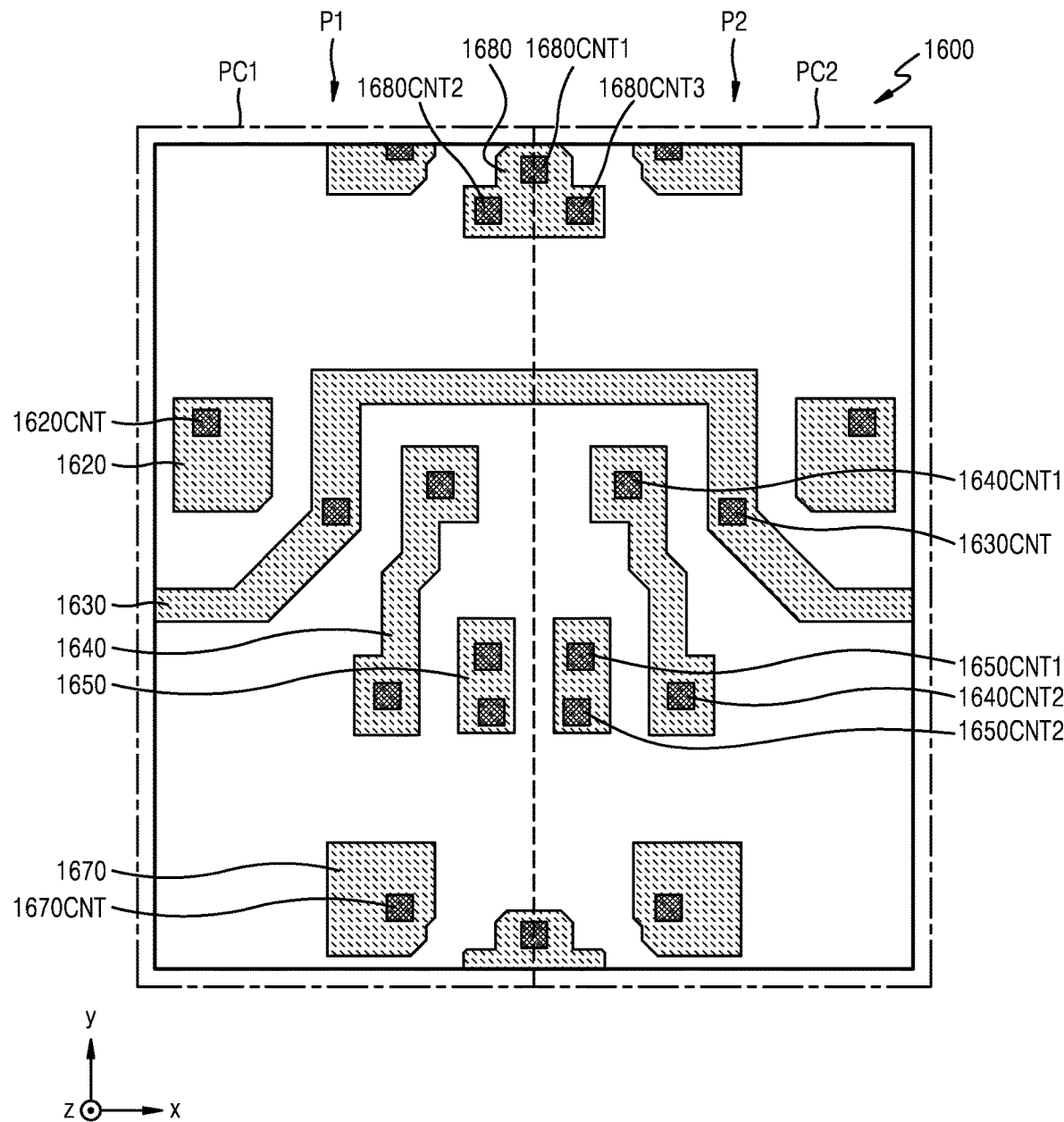

As shown in FIG. 12, a first connection electrode layer 1600 may be arranged on the second interlayer insulating layer 119. The first connection electrode layer 1600 may include a second transfer line 1620, a second initialization voltage line 1630, a third transfer line 1640, a fourth transfer line 1650, a fifth transfer line 1670, and a sixth transfer line 1680.

The second transfer line 1620 may be electrically connected to the first semiconductor layer 1100 through a contact hole 1620CNT. A data signal Dm from the data line 1810, which is described in more detail below with reference to FIG. 14, may be transferred to the first semiconductor layer 1100 through the second transfer line 1620, and thus, applied to the switching transistor T2.

The second initialization voltage line 1630 may extend in the second direction (e.g., the x-axis direction). The second initialization voltage line 1630 corresponding to the second initialization voltage line VL2 shown in FIG. 5 may be configured to apply the second initialization voltage Vint2 to the pixels. The second initialization voltage line 1630 is electrically connected to the first semiconductor layer 1100 through a contact hole 1630CNT, and thus, the second initialization voltage Vint2 may be transferred to the first semiconductor layer 1100 and applied to the second initialization transistor T7.

The third transfer line 1640 may electrically connect the second semiconductor layer 1400 to the first transfer line 1540 through contact holes 1640CNT1 and 1640CNT2 formed at (e.g., in or on) one side and another side (e.g., opposite sides) thereof. The first transfer line 1540 is electrically connected to the first gate electrode 1220, which is the driving gate electrode. As a result, the third transfer line 1640 may electrically connect a first initialization semiconductor layer, which is a portion of the second semiconductor layer 1400, to the driving gate electrode. The first initialization voltage Vint1 may be transferred to the first gate electrode 1220, which is the driving gate electrode, through the second semiconductor layer 1400, the third transfer line 1640, and the first transfer line 1540.

The fourth transfer line 1650 may electrically connect the second semiconductor layer 1400 to the first semiconductor layer 1100 through contact holes 1650CNT1 and 1650CNT2 formed at (e.g., in or on) one side and another side (e.g., opposite sides) thereof. In other words, the fourth transfer line 1650 may electrically connect the compensation transistor T3 to the driving transistor T1.

The fifth transfer line 1670 may be electrically connected to the first semiconductor layer 1100 through a contact hole 1670CNT. The fifth transfer line 1670 may be configured to transfer the driving current or the second initialization voltage Vint2 to the organic light-emitting diode OLED, the driving current being from the first semiconductor layer 1100.

The sixth transfer line 1680 may be electrically connected to the second semiconductor layer 1400 through the contact holes 1680CNT2 and 1680CNT3. In addition, the sixth transfer line 1680 may be electrically connected to the first initialization voltage line 1340 of FIG. 9 through the contact hole 1680CNT1. The sixth transfer line 1680 may be configured to transfer the first initialization voltage Vint1 to the first initialization transistor T4, the first initialization voltage Vint1 being from the first initialization voltage line 1340.

The first connection electrode layer 1600 may include a metal, an alloy, a conductive metal oxide, or a transparent conductive material. As an example, the first connection electrode layer 1600 may include silver (Ag), an alloy containing silver (Ag), molybdenum (Mo), an alloy containing molybdenum (Mo), aluminum (Al), an alloy containing aluminum (Al), aluminum nitride (AlN), tungsten (W), tungsten nitride (WN), copper (Cu), nickel (Ni), chrome (Cr), chrome nitride (CrN), titanium (Ti), tantalum (Ta), platinum (Pt), scandium (Sc), indium tin oxide (ITO), or indium zinc oxide (IZO). The first connection electrode layer 1600 may have a multi-layered structure, for example, such as a two-layered structure of Ti/Al, or a three-layered structure of Ti/Al/Ti.

A first planarization insulating layer 121 may cover the first connection electrode layer 1600, and may be arranged on the second interlayer insulating layer 119. The first planarization insulating layer 121 may include an organic insulating material. As an example, the first planarization insulating layer 121 may include a photoresist, benzocyclobutene (BCB), polyimide, hexamethyldisiloxane (HMDSO), polymethylmethacrylate (PMMA), polystyrene (PS), polymer derivatives having a phenol-based group, an acryl-based polymer, an imide-based polymer, an aryl ether-based polymer, an amide-based polymer, a fluorine-based polymer, a p-xylene-based polymer, a vinyl alcohol-based polymer, or a mixture thereof.

Figure 13:
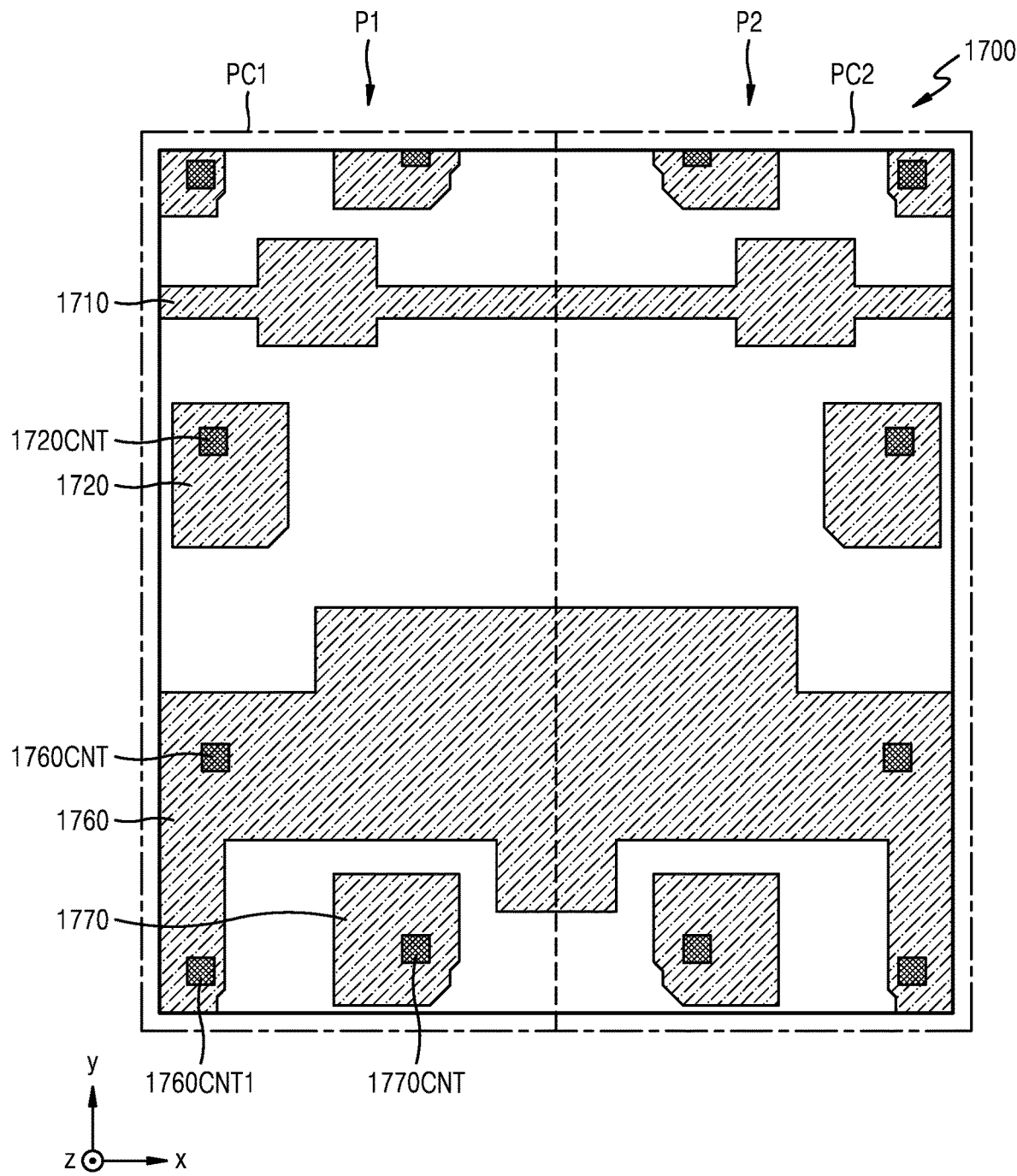

As shown in FIG. 13, a second connection electrode layer 1700 may be arranged on the first planarization insulating layer 121. The second connection electrode layer 1700 may include a horizontal connection line 1710, a seventh transfer line 1720, an eighth transfer line 1760, and a ninth transfer line 1770.

The horizontal connection line 1710 may extend in the second direction (e.g., the x-axis direction). The horizontal connection line 1710 may be one of the first horizontal connection line HCL1 or the second horizontal connection line HCL2 described above with reference to FIG. 4 depending on the location of the pixel. In other words, the first horizontal connection line HCL1 may be arranged at (e.g., in or on) the same layer as that of the second horizontal connection line HCL2.

The seventh transfer line 1720 may be electrically connected to the second transfer line 1620 through a contact hole 1720CNT. A data signal Dm from the data line 1810 described in more detail below with reference to FIG. 14 may be transferred to the first semiconductor layer 1100 through the seventh transfer line 1720 and the second transfer line 1620, and thus, may be applied to the switching transistor T2.

The eighth transfer line 1760 may extend in the second direction (e.g., the x-axis direction). The driving voltage ELVDD from a driving voltage line 1830 to be described in more detail below with reference to FIG. 14 is transferred to the eighth transfer line 1760. The eighth transfer line 1760 may be electrically connected to the first semiconductor layer 1100 through a contact hole 1760CNT1, and may be configured to transfer the driving voltage ELVDD to the first semiconductor layer 1100, and more specifically, to the operation control transistor T5. In addition, the eighth transfer line 1760 may be configured to transfer the driving voltage ELVDD to the capacitor upper electrode 1330, because the eighth transfer line 1760 is electrically connected to the capacitor upper electrode 1330 (e.g., the second capacitor electrode CE2) through the contact hole 1760CNT.

The ninth transfer line 1770 may be electrically connected to the fifth transfer line 1670 through a contact hole 1770CNT. The ninth transfer line 1770 may be configured to receive the driving current or the second initialization voltage Vint2 from the fifth transfer line 1670, and may transfer the driving current or the second initialization voltage Vint2 to the organic light-emitting diode OLED, the driving current being from the first semiconductor layer 1100.

The second connection electrode layer 1700 may include a metal, an alloy, a conductive metal oxide, or a transparent conductive material. As an example, the second connection electrode layer 1700 may include silver (Ag), an alloy containing silver (Ag), molybdenum (Mo), an alloy containing molybdenum (Mo), aluminum (Al), an alloy containing aluminum (Al), aluminum nitride (AlN), tungsten (W), tungsten nitride (WN), copper (Cu), nickel (Ni), chrome (Cr), chrome nitride (CrN), titanium (Ti), tantalum (Ta), platinum (Pt), scandium (Sc), indium tin oxide (ITO), or indium zinc oxide (IZO). The second connection electrode layer 1700 may have a multi-layered structure, for example, such as a two-layered structure of Ti/Al, or a three-layered structure of Ti/Al/Ti.

A second planarization insulating layer 123 (e.g., see FIG. 15) may cover the second connection electrode layer 1700, and may be arranged on the first planarization insulating layer 121. The second planarization insulating layer 123 may include an organic insulating material. As an example, the second planarization insulating layer 123 may include a photoresist, benzocyclobutene (BCB), polyimide, hexamethyldisiloxane (HMDSO), polymethylmethacrylate (PMMA), polystyrene (PS), polymer derivatives having a phenol-based group, an acryl-based polymer, an imide-based polymer, an aryl ether-based polymer, an amide-based polymer, a fluorine-based polymer, a p-xylene-based polymer, a vinyl alcohol-based polymer, or a mixture thereof.

As shown in FIG. 14, a third connection electrode layer 1800 may be arranged on the second planarization insulating layer 123. The third connection electrode layer 1800 may include a data line 1810, a vertical connection line 1820, a driving voltage line 1830, and a tenth transfer line 1840.

The data line 1810 may extend in the first direction (e.g., the y-axis direction). The data line 1810 may correspond to the data line DL shown in FIG. 5. In addition, depending on the location of a pixel, the data line 1810 may be one of the first-first data line DL1-1, the first-second data line DL1-2, the second data line DL2, the third-first data line DL3-1, or the third-second data line DL3-2. In other words, the first-first data line DL1-1, the first-second data line DL1-2, the second data line DL2, the third-first data line DL3-1, and the third-second data line DL3-2 may be arranged at (e.g., in or on) the same layer as each other.

Because the data line 1810 may be electrically connected to the seventh transfer line 1720 through a contact hole 1810CNT, a data signal Dm from the data line 1810 may be transferred to the first semiconductor layer 1100 through the seventh transfer line 1720 and the second transfer line 1620, and thus, applied to the switching transistor T2.

The vertical connection line 1820 may extend in the first direction (e.g., the y-axis direction). The vertical connection line 1820 may be one of the first vertical connection line VCL1 or the second vertical connection line VCL2 described above with reference to FIG. 4 depending on the location of a pixel.

The driving voltage line 1830 may extend in the first direction (e.g., the y-axis direction). The driving voltage line 1830 may correspond to the driving voltage line PL shown in FIG. 5. The driving voltage line 1830 may be configured to apply the driving voltage ELVDD to the pixels. The driving voltage line 1830 may be electrically connected to the eighth transfer line 1760 through a contact hole 1830CNT, to allow the driving voltage ELVDD to be transferred to the operation control transistor T5 and the capacitor upper electrode 1330 as described above. The driving voltage line 1830 of the first pixel circuit PC1 may be one body with the driving voltage line 1830 of the second pixel circuit PC2.

The tenth transfer line 1840 may be electrically connected to the ninth transfer line 1770 through a contact hole 1840CNT1, to receive the driving current or the second initialization voltage Vint2 from the fifth transfer line 1670 and the ninth transfer line 1770, the driving current being from the first semiconductor layer 1100. In addition, the tenth transfer line 1840 may be configured to transfer the driving current or the second initialization voltage Vint2 to the first electrode (e.g., the pixel electrode) of the organic light-emitting diode OLED through a contact hole 1840CNT2 formed in an insulating layer thereon, the driving current being from the first semiconductor layer 1100.

The third connection electrode layer 1800 may include a metal, an alloy, a conductive metal oxide, or a transparent conductive material. As an example, the third connection electrode layer 1800 may include silver (Ag), an alloy containing silver (Ag), molybdenum (Mo), an alloy containing molybdenum (Mo), aluminum (Al), an alloy containing aluminum (Al), aluminum nitride (AlN), tungsten (W), tungsten nitride (WN), copper (Cu), nickel (Ni), chrome (Cr), chrome nitride (CrN), titanium (Ti), tantalum (Ta), platinum (Pt), scandium (Sc), indium tin oxide (ITO), or indium zinc oxide (IZO). The third connection electrode layer 1800 may have a multi-layered structure, for example, such as a two-layered structure of Ti/Al, or a three-layered structure of Ti/Al/Ti.

As shown in FIG. 15, a third planarization insulating layer 125 may cover the third connection electrode layer 1800, and may be arranged on the second planarization insulating layer 123. The third planarization insulating layer 125 may include an organic insulating material. As an example, the third planarization insulating layer 125 may include benzocyclobutene (BCB), polyimide, hexamethyldisiloxane (HMDSO), polymethylmethacrylate (PMMA), polystyrene (PS), polymer derivatives having a phenol-based group, an acryl-based polymer, an imide-based polymer, an aryl ether-based polymer, an amide-based polymer, a fluorine-based polymer, a p-xylene-based polymer, a vinyl alcohol-based polymer, or a mixture thereof.

The organic light-emitting diode OLED may be arranged on third planarization insulating layer 125. The organic light-emitting diode OLED may include a pixel electrode 210, an intermediate layer 220, and an opposite electrode 230. The intermediate layer 220 includes an emission layer.

The pixel electrode 210 may be a (semi) transmissive electrode or reflective electrode. As an example, the pixel electrode 210 may include a reflective layer, and a transparent or semi-transparent electrode layer on the reflective layer. The reflective layer may include silver (Ag), magnesium (Mg), aluminum (Al), platinum (Pt), palladium (Pd), gold (Au), nickel (Ni), neodymium (Nd), iridium (Ir), chrome (Cr), or a compound thereof. The transparent or semi-transparent electrode layer may include at least one of indium tin oxide (ITO), indium zinc oxide (IZO), zinc oxide (ZnO), indium oxide ($In_2O_3$), indium gallium oxide (IGO), or aluminum zinc oxide (AZO). As an example, the pixel electrode 210 may have a three-layered structure of ITO/Ag/ITO.

A pixel-defining layer 127 may be arranged on the third planarization insulating layer 125. The pixel-defining layer 127 may prevent or substantially prevent an arc and/or the like from occurring at the edges of the pixel electrode 210 by increasing a distance between the edges of the pixel electrode 210 and the opposite electrode 230 over the pixel electrode 210.

The pixel-defining layer 127 may include an organic insulating material, for example, such as polyimide, an acrylic resin, benzocyclobutene, a phenolic resin, and/or the like, and be formed by using spin coating and/or the like.

At least a portion of the intermediate layer 220 of the organic light-emitting diode OLED may be arranged in an opening OP of the pixel-defining layer 127. An emission area EA of the organic light-emitting diode OLED may be defined by the opening OP.

The intermediate layer 220 may include the emission layer. The emission layer may include an organic material including a fluorescent or phosphorous material for emitting red, green, blue, or white light. The emission layer may include a polymer organic material or a low molecular weight organic material. Functional layers may be selectively further arranged under (e.g., underneath) and/or above the emission layer. Such functional layers may include, for example, a hole transport layer (HTL), a hole injection layer (HIL), an electron transport layer (ETL), and/or an electron injection layer (EIL).

The emission layer may have a shape patterned to correspond to each of the pixel electrodes 210. Layers of the intermediate layer 220, except the emission layer, may be formed as one body over the plurality of pixel electrodes 210. However, various suitable modifications may be made as would be understood by those having ordinary skill in the art.

The opposite electrode 230 may be a light-transmissive electrode or a reflective electrode. As an example, the opposite electrode 230 may be a transparent or semi-transparent electrode, and may include at least one of lithium (Li), calcium (Ca), lithium fluoride (LiF), aluminum (Al), silver (Ag), magnesium (Mg), or a compound thereof. In addition, the opposite electrode 230 may further include a transparent conductive oxide (TCO), for example, such as ITO, IZO, ZnO, or $In_2O_3$, on a metal thin film. The opposite electrode 230 may be formed as one body over the entire surface of the display area DA, and may be arranged on the intermediate layer 220 and the pixel-defining layer 127.

In the case of the first-first main pixel Pm1-1, the first-second main pixel Pm1-2, the second-first main pixel Pm2-1, the second-second main pixel Pm2-2, the third-first main pixel Pm3-1, the third-second main pixel Pm3-2, and the first auxiliary pixel Pa1 described above with reference to FIG. 4, the organic light-emitting diode OLED, which is a display element, may overlap with the pixel circuit, and may be arranged on the pixel circuit as shown in FIG. 15. In the case of the second auxiliary pixel Pa2, unlike in FIG. 15, the organic light-emitting diode OLED, which is the second auxiliary display element, may not overlap with the second auxiliary pixel circuit PCa2. Further, in some embodiments, unlike in FIG. 15, the organic light-emitting diode OLED of the first auxiliary pixel Pa1, which is the first auxiliary display element, may not overlap with the first auxiliary pixel circuit PCa1.

Figure 16:
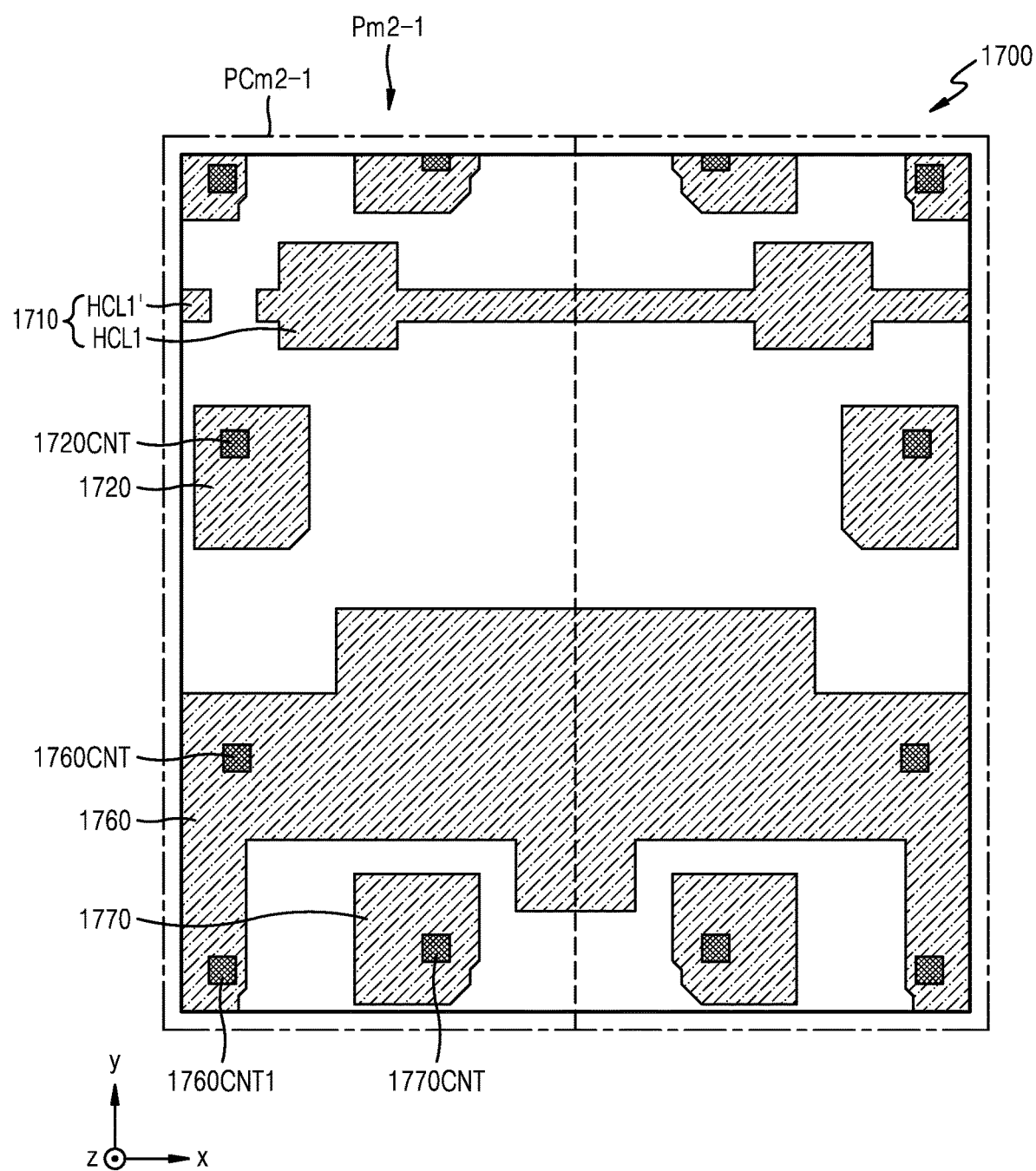
FIGS. 16-17 are arrangement views of elements of a pixel of the display panel of FIG. 4.
Figure 17:
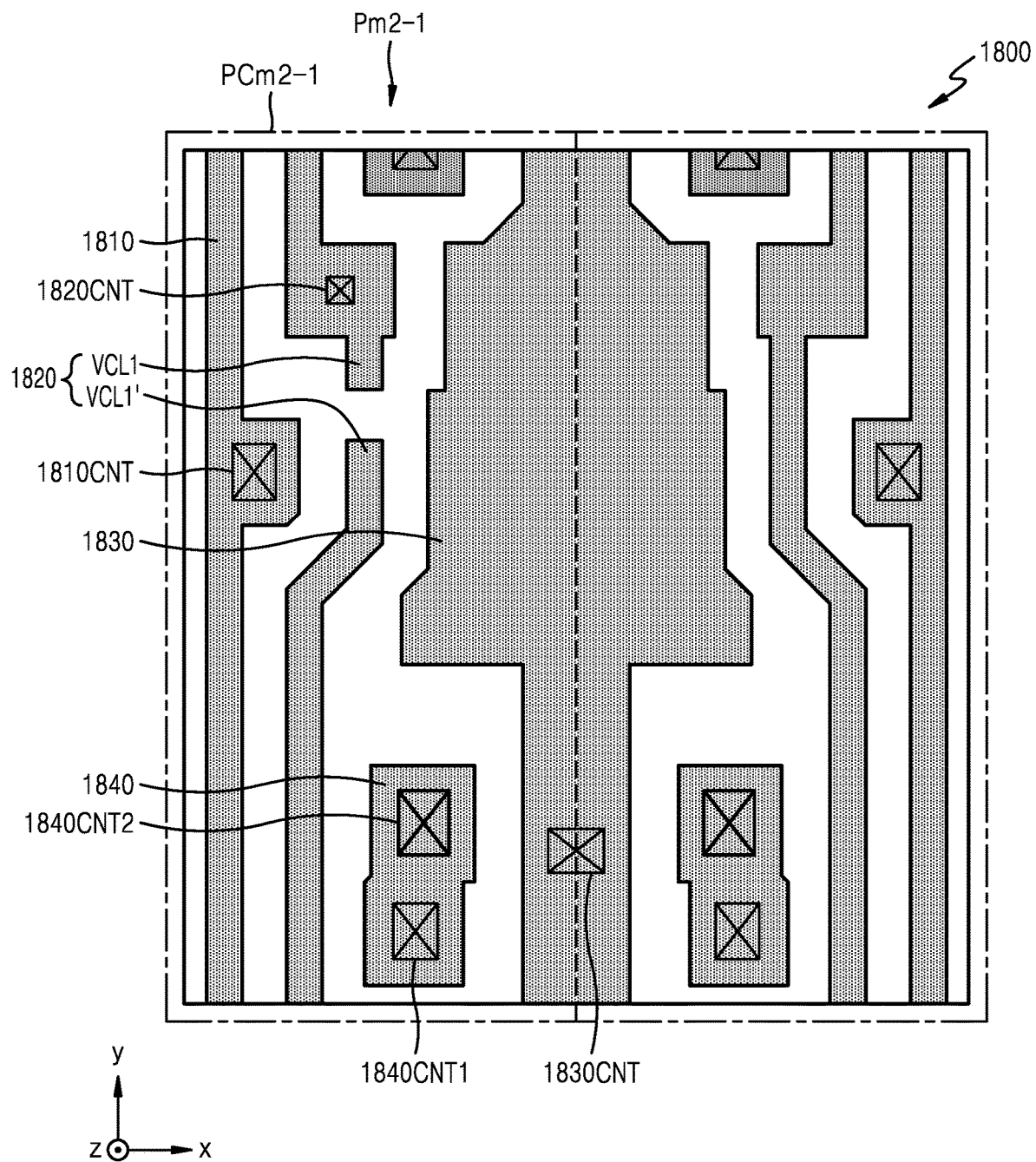

FIGS. 16 and 17 are arrangement views of elements of the second-first main pixel Pm2-1 of the display panel 10 of FIG. 4. For convenience, FIGS. 16 and 17 show the second-first main pixel Pm2-1, and a pixel adjacent to the second-first main pixel Pm2-1 in the second direction (e.g., the x-axis direction). At a point where the second-first main pixel Pm2-1 is arranged, the first vertical connection line VCL1 is electrically connected to the first horizontal connection line HCL1.

As shown in FIG. 16, the horizontal connection line 1710 is cut off (e.g., disconnected) at the second-first main pixel Pm2-1. Accordingly, the horizontal connection line 1710 includes the first horizontal connection line HCL1 and a first dummy horizontal connection line HCL1'. Similarly, as shown in FIG. 17, the vertical connection line 1820 is cut off (e.g., disconnected) at the second-first main pixel Pm2-1. Accordingly, the vertical connection line 1820 includes the first vertical connection line VCL1 and a first dummy vertical connection line VCL1'. The first vertical connection line VCL1 may be electrically connected to the first horizontal connection line HCL1 through a contact hole 1820CNT formed in an insulating layer therebetween. Similarly, depending on the position of a pixel inside the display apparatus 1, the horizontal connection line 1710 may be disconnected, the vertical connection line 1820 may be disconnected, and there may be a contact hole 1820CNT inside the relevant pixel.

For convenience of illustration, while FIG. 4 shows only the first dummy vertical connection line VCL1' and the first dummy horizontal connection line HCL1', there may be more dummy vertical connection lines and more dummy horizontal connection lines.

Figure 18:
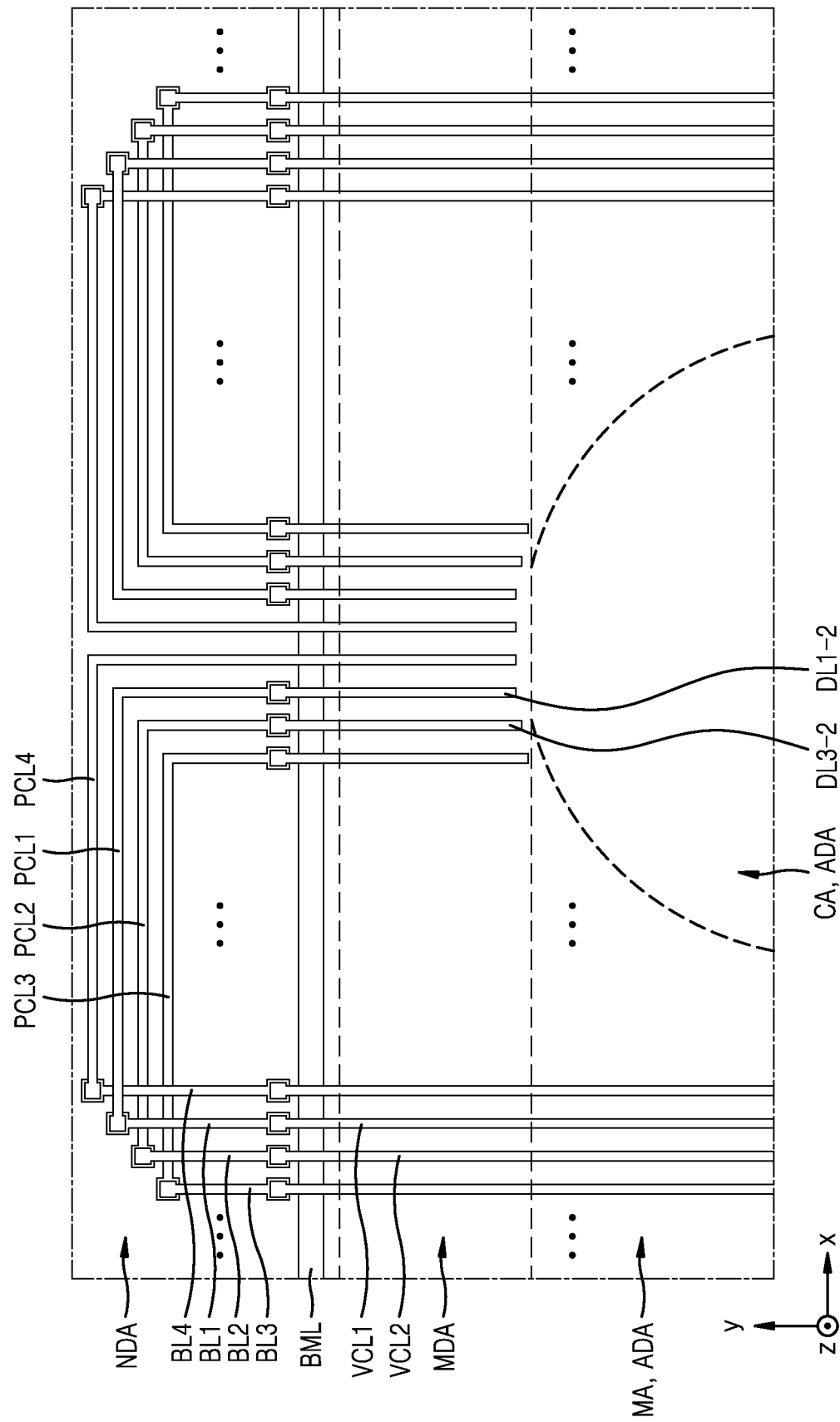
FIG. 18 is a plan view of a portion of a display panel that may be included in the display apparatus of FIG. 1.

FIG. 18 is a plan view of a portion of a display panel 10 that may be included in the display apparatus of FIG. 1. In more detail, FIG. 18 is a plan view of a portion of the peripheral area NDA in which the first peripheral connection line PCL1 and the second peripheral connection line PCL2 are arranged, and portions of the main display area MDA and the auxiliary display area ADA in the vicinity thereof.

As described above, one end of the first peripheral connection line PCL1 is electrically connected to the first vertical connection line VCL1 extending in the second portion of the main display area MDA, and the first peripheral connection line PCL1 extends approximately in the second direction (e.g., the x-axis direction). As shown in FIG. 18, the first peripheral connection line PCL1 approximately extends in the second direction (e.g., the x-axis direction) and has a bent portion, and thus, has a "¬" shape. Another end of the first peripheral connection line PCL1 is electrically connected to the first-second data line DL1-2. Similarly, one end of the second peripheral connection line PCL2 is electrically connected to the second vertical connection line VCL2 extending in the second portion of the main display area MDA, and the second peripheral connection line PCL2 extends approximately in the second direction (e.g., the x-axis direction). As shown in FIG. 18, the second peripheral connection line PCL2 approximately extends in the second direction (e.g., the x-axis direction) and has a bent portion, and thus, has a "¬" shape. Another end of the second peripheral connection line PCL2 is electrically connected to the third-second data line DL3-2. At least a portion of each of the first peripheral connection line PCL1 and the second peripheral connection line PCL2 may be arranged at (e.g., in or on) the peripheral area NDA outside the main display area MDA. For example, as shown in FIG. 18, all (e.g., an entirety) of the first peripheral connection line PCL1 and all (e.g., an entirety) of the second peripheral connection line PCL2 may be arranged at (e.g., in or on) the peripheral area NDA.

Because one end of the first peripheral connection line PCL1 is electrically connected to the first vertical connection line VCL1 extending in the second portion of the main display area MDA, a first bridge line BL1 may be arranged between one end of the first peripheral connection line PCL1 and the first vertical connection line VCL1 to electrically connect the first peripheral connection line PCL1 to the first vertical connection line VCL1. In addition, because one end of the second peripheral connection line PCL2 is electrically connected to the second vertical connection line VCL2 extending in the second portion of the main display area MDA, a second bridge line BL2 may be arranged between one end of the second peripheral connection line PCL2 and the second vertical connection line VCL2 to electrically connect the second peripheral connection line PCL2 to the second vertical connection line VCL2.

FIG. 18 shows a third peripheral connection line PCL3 and a fourth peripheral connection line PCL4, in addition to the first peripheral connection line PCL1 and the second peripheral connection line PCL2. In more detail, as shown in FIG. 18, the first peripheral connection line PCL1 may be closer to the main display area MDA than the fourth peripheral connection line PCL4, the second peripheral connection line PCL2 may be closer to the main display area MDA than the first peripheral connection line PCL1, and the third peripheral connection line PCL3 may be closer to the main display area MDA than the second peripheral connection line PCL2. A third bridge line BL3 is electrically connected to the third peripheral connection line PCL3, and a fourth bridge line BL4 is electrically connected to the fourth peripheral connection line PCL4.

The first bridge line BL1, the second bridge line BL2, the third bridge line BL3, and the fourth bridge line BL4 may be included, for example, in the third gate layer 1500 described above with reference to FIG. 11. In other words, the first bridge line BL1, the second bridge line BL2, the third bridge line BL3, and the fourth bridge line BL4 may include the same material as that of the fifth gate line 1520 and the like, and be concurrently formed (e.g., may be simultaneously formed) at (e.g., in or on) the same layer as that of the fifth gate line 1520.

The first peripheral connection line PCL1, the second peripheral connection line PCL2, and the third peripheral connection line PCL3 cross the first bridge line BL1, the second bridge line BL2, and/or the fourth bridge line BL4. Accordingly, the first peripheral connection line PCL1, the second peripheral connection line PCL2, the third peripheral connection line PCL3, and the fourth peripheral connection line PCL4 may be disposed at (e.g., in or on) a layer different from a layer at (e.g., in or on) which the first bridge line BL1, the second bridge line BL2, the third bridge line BL3, and the fourth bridge line BL4 are arranged. For example, the first peripheral connection line PCL1, the second peripheral connection line PCL2, the third peripheral connection line PCL3, and the fourth peripheral connection line PCL4 may include the same material as that of the first gate layer 1200 and may be concurrently (e.g., simultaneously) formed at (e.g., in or on) the same layer as that of the first gate layer 1200 described above with reference to FIG. 8, may include the same material as that of the second gate layer 1300 and may be concurrently (e.g., simultaneously) formed at (e.g., in or on) the same layer as that of the second gate layer 1300 described above with reference to FIG. 9, may include the same material as that of the first connection electrode layer 1600 and may be concurrently (e.g., simultaneously) formed at (e.g., in or on) the same layer as that of the first connection electrode layer 1600 described above with reference to FIG. 12, may include the same material as that of the second connection electrode layer 1700 and may be concurrently (e.g., simultaneously) formed at (e.g., in or on) the same layer as that of the second connection electrode layer 1700 described above with reference to FIG. 13, or may include the same material as that of the third connection electrode layer 1800 and may be concurrently (e.g., simultaneously) formed at (e.g., in or on) the same layer as that of the third connection electrode layer 1800 described above with reference to FIG. 14.

As an example, it is shown in FIG. 18 that the third peripheral connection line PCL3 is arranged at (e.g., in or on) the same layer as that of the first gate layer 1200, the second peripheral connection line PCL2 is arranged at (e.g., in or on) the same layer as that of the second gate layer 1300, the first peripheral connection line PCL1 is arranged at (e.g., in or on) the same layer as that of the first connection electrode layer 1600 or the second connection electrode layer 1700, and the fourth peripheral connection line PCL4 is arranged at (e.g., in or on) the same layer as that of the third connection electrode layer 1800, but the present disclosure is not limited thereto. In this example, it is shown that the fourth peripheral connection line PCL4 is one body with the data line connected thereto.

The reason that the first peripheral connection line PCL1, the second peripheral connection line PCL2, the third peripheral connection line PCL3, and the fourth peripheral connection line PCL4 may be arranged at (e.g., in or on) different layers is that these layers may cross one another from different layers when needed or desired. As an example, although it is shown in FIG. 18 that the second peripheral connection line PCL2 is closer to the main display area MDA than the first peripheral connection line PCL1, unlike this, when various wirings are arranged at (e.g., in or on) the peripheral area NDA, the first peripheral connection line PCL1 may be closer to the main display area MDA than the second peripheral connection line PCL2. In this case, because the first peripheral connection line PCL1 crosses the second peripheral connection line PCL2, the first peripheral connection line PCL1 may be disposed at (e.g., in or on) a layer different from a layer at (e.g., in or on) which the second peripheral connection line PCL2 is disposed.

Thus, the first bridge line BL1 and the second bridge line BL2 may be arranged on an insulating layer covering one of the first peripheral connection line PCL1 or the second peripheral connection line PCL2, and the other of the first peripheral connection line PCL1 or the second peripheral connection line PCL2 may be arranged on an insulating layer covering the first bridge line BL1 and the second bridge line BL2. For example, as shown in FIG. 18, the first bridge line BL1 and the second bridge line BL2 may be arranged on an insulating layer covering the second peripheral connection line PCL2, and the first peripheral connection line PCL1 may be arranged on an insulating layer covering the first bridge line BL1 and the second bridge line BL2.

As shown in FIG. 18, the bottom metal layer BML may be arranged at (e.g., in or on) the peripheral area NDA. In this case, the bottom metal layer BML shown in FIG. 18 may be electrically connected to the driving voltage line 1830 arranged at (e.g., in or on) the display area DA to transfer the driving voltage into the display area DA. The first-second data line DL1-2, the third-second data line DL3-2, the first vertical connection line VCL1, the second vertical connection line VCL2, and the like may cross the bottom metal layer BML, while the first-second data line DL1-2, the third-second data line DL3-2, the first vertical connection line VCL1, the second vertical connection line VCL2, and the like are disposed at (e.g., in or on) a layer different from a layer at (e.g., in or on) which the bottom metal layer BML is disposed.

Figure 19:
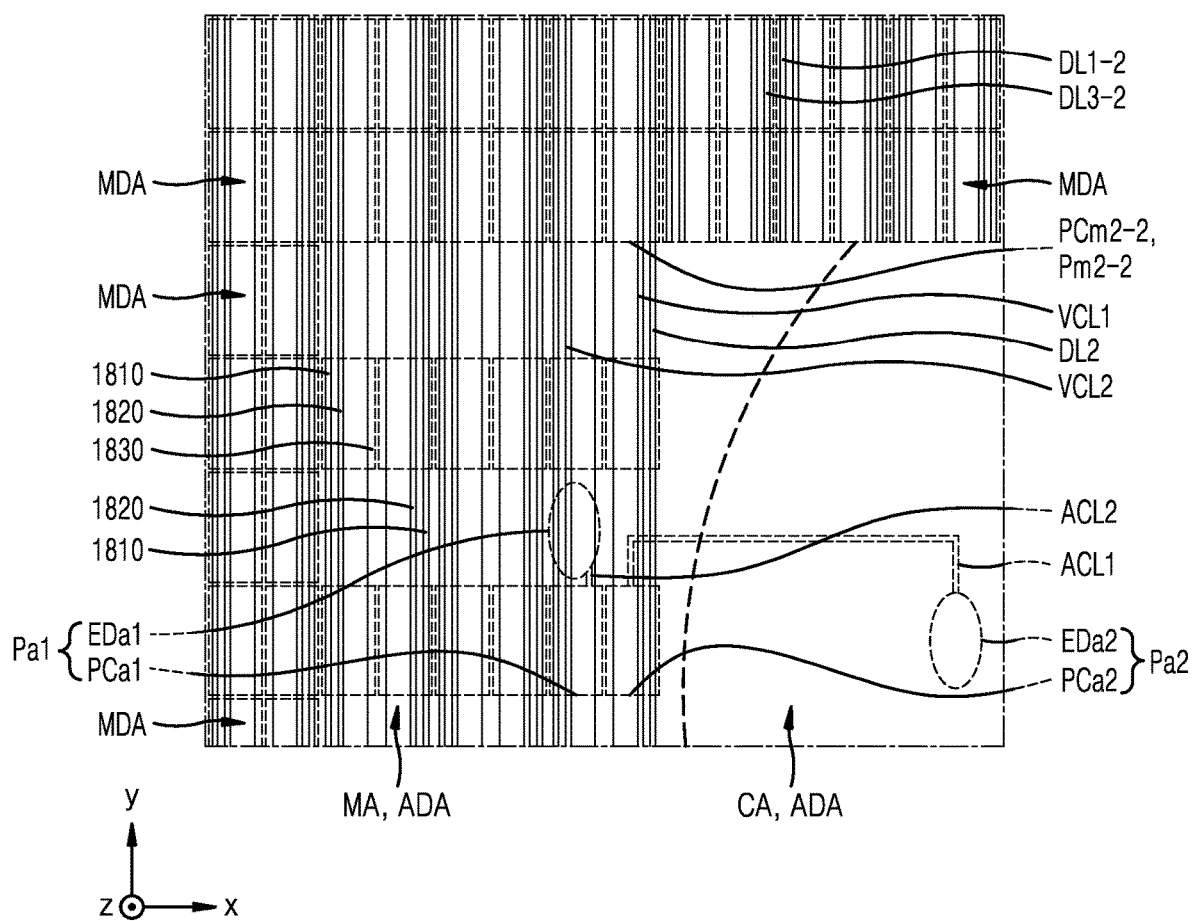
FIG. 19 is a plan view of a portion of a display panel that may be included in the display apparatus of FIG. 1.

FIG. 19 is a plan view of a portion of a display panel 10 that may be included in the display apparatus 1 of FIG. 1. Because each of FIGS. 4 and 19 shows a portion of the display panel 10, some elements of FIG. 19 are shown different from the elements shown in FIG. 4. However, in FIGS. 19 and 4, the same reference symbols are used to denote the same or substantially the same elements, and thus, redundant description thereof may not be repeated. In FIG. 19, small rectangles denoted by dashed lines in the main display area MDA and the intermediate area MA denote pixel circuits. As described above with reference to FIG. 14, the data line 1810, the vertical connection line 1820, and the driving voltage line 1830 extend in the first direction (e.g., the y-axis direction).

As described above, the second auxiliary display element EDa2 may be electrically connected to the second auxiliary pixel circuit PCa2 by the first auxiliary connection line ACL1 to implement the second auxiliary pixel Pa2. FIG. 19 shows an example of the first auxiliary connection line ACL1. In the first auxiliary pixel Pa1, although the first auxiliary display element EDa1 may overlap with the first auxiliary pixel circuit PCa1 as described above, the present disclosure is not limited thereto. As an example, as shown in FIG. 19, even in the first auxiliary pixel Pa1, the first auxiliary display element EDa1 may not overlap with the first auxiliary pixel circuit PCa1. In this case, the first auxiliary display element EDa1 may be electrically connected to the first auxiliary pixel circuit PCa1 by a second auxiliary connection line ACL2 to implement the first auxiliary pixel Pa1. The second auxiliary connection line ACL2 may include the same material as that of the first auxiliary connection line ACL1, and may be arranged at (e.g., in or on) the same layer as that of the first auxiliary connection line ACL1. For example, the first auxiliary display element EDa1 may overlap with a portion (e.g., with only a portion) of the first auxiliary pixel circuit PCa1. However, various suitable modifications may be made as would be understood by those having ordinary skill in the art. In any case, the first auxiliary display element EDa1 may be arranged inside the intermediate area MA.

For convenience of illustration, FIG. 19 shows the first auxiliary display element EDa1 and the second auxiliary display element EDa2, and the second-second main display element EDm2-2 and the like are not shown.

According to one or more embodiments of the present disclosure, a display apparatus that may display high-quality images may be implemented. However, the spirit and scope of the present disclosure are not limited thereto or thereby.

Although some embodiments have been described, those skilled in the art will readily appreciate that various modifications are possible in the embodiments without departing from the spirit and scope of the present disclosure. It will be understood that descriptions of features or aspects within each embodiment should typically be considered as available for other similar features or aspects in other embodiments, unless otherwise described. Thus, as would be apparent to one of ordinary skill in the art, features, characteristics, and/or elements described in connection with a particular embodiment may be used singly or in combination with features, characteristics, and/or elements described in connection with other embodiments unless otherwise specifically indicated. Therefore, it is to be understood that the foregoing is illustrative of various example embodiments and is not to be construed as limited to the specific embodiments disclosed herein, and that various modifications to the disclosed embodiments, as well as other example embodiments, are intended to be included within the spirit and scope of the present disclosure as defined in the appended claims, and their equivalents.

What is claimed is:

1. A display apparatus comprising:
a substrate including an auxiliary display area, and a main display area surrounding the auxiliary display area, the auxiliary display area including a component area and an intermediate area;
a first-first main pixel circuit, and a first-first main display element electrically connected to the first-first main pixel circuit, the first-first main pixel circuit and the first-first main display element being located at a first portion of the main display area, the first portion being at one side of the auxiliary display area;
a first-second main pixel circuit, and a first-second main display element electrically connected to the first-second main pixel circuit, the first-second main pixel circuit and the first-second main display element being located at a second portion of the main display area, the second portion being at another side of the auxiliary display area;
a first auxiliary pixel circuit, and a first auxiliary display element electrically connected to the first auxiliary pixel circuit, the first auxiliary pixel circuit and the first auxiliary display element being located at the intermediate area;
a second auxiliary pixel circuit located at the intermediate area;
a second auxiliary display element located at the component area;
an auxiliary connection line connecting the second auxiliary display element to the second auxiliary pixel circuit;
a first-first data line electrically connected to the first-first main pixel circuit, the first-first data line being located at the first portion of the main display area, and extending in a first direction from the first portion of the main display area to the auxiliary display area;
a first horizontal connection line electrically connected to the first-first data line, the first horizontal connection line being located at the main display area, and extending in a second direction crossing the first direction;
a first vertical connection line electrically connected to the first horizontal connection line, and extending in the first direction from the first portion of the main display area into the second portion of the main display area through the intermediate area;
a first peripheral connection line electrically connected to the first vertical connection line extending in the second portion of the main display area, the first peripheral connection line extending in the second direction; and
a first-second data line electrically connected to the first-second main pixel circuit, the first-second data line being located at the second portion of the main display area, and extending in the first direction to be electrically connected to the first peripheral connection line.

2. The display apparatus of claim 1, wherein the first-first main display element and the first-second main display element are located at a same column as each other, the column extending in the first direction.

3. The display apparatus of claim 1, wherein the second auxiliary pixel circuit is electrically connected to the first vertical connection line.

4. The display apparatus of claim 1, wherein the first-first data line, the first-second data line, and the first vertical connection line are at a same layer as each other.

5. The display apparatus of claim 1, further comprising:
a second-first main pixel circuit, and a second-first main display element electrically connected to the second-first main pixel circuit, the second-first main pixel circuit and the second-first main display element being located at the first portion of the main display area;
a second-second main pixel circuit, and a second-second main display element electrically connected to the second-second main pixel circuit, the second-second main pixel circuit and the second-second main display element being located at the second portion of the main display area; and
a second data line electrically connected to the second-first main pixel circuit and the second-second main pixel circuit, the second data line extending in the first direction to pass the first portion of the main display area, the intermediate area, and the second portion of the main display area.

6. The display apparatus of claim 5, wherein the second-first main display element and the second-second main display element are located at a same column as each other, the column extending in the first direction.

7. The display apparatus of claim 1, wherein at least a portion of the first peripheral connection line is located at a peripheral area outside the main display area.

8. The display apparatus of claim 1, further comprising:
a third-first main pixel circuit, and a third-first main display element electrically connected to the third-first main pixel circuit, the third-first main pixel circuit and the third-first main display element being located at the first portion of the main display area;
a third-second main pixel circuit, and a third-second main display element electrically connected to the third-second main pixel circuit, the third-second main pixel circuit and the third-second main display element being located at the second portion of the main display area;
a third-first data line electrically connected to the third-first main pixel circuit, the third-first data line extending in the first direction, and located at the first portion of the main display area;
a second horizontal connection line electrically connected to the third-first data line, the second horizontal connection line extending in the second direction, and located at the main display area;
a second vertical connection line electrically connected to the second horizontal connection line, and extending in the first direction from the first portion of the main display area into the second portion of the main display area through the intermediate area;
a second peripheral connection line electrically connected to the second vertical connection line extending in the second portion of the main display area, the second peripheral connection line extending in the second direction; and
a third-second data line electrically connected to the third-second main pixel circuit, the third-second data line being located at the second portion of the main display area, and extending in the first direction to be electrically connected to the second peripheral connection line.

9. The display apparatus of claim 8, wherein the third-first main display element and the third-second main display element are located at a same column as each other, the column extending in the first direction.

10. The display apparatus of claim 8, wherein the first auxiliary pixel circuit is electrically connected to the second vertical connection line.

11. The display apparatus of claim 8, wherein the third-first data line, the third-second data line, and the second vertical connection line are located at a same layer as each other.

12. The display apparatus of claim 8, further comprising:
a second-first main pixel circuit, and a second-first main display element electrically connected to the second-first main pixel circuit, the second-first main pixel circuit and the second-first main display element being located at the first portion of the main display area;
a second-second main pixel circuit, and a second-second main display element electrically connected to the second-second main pixel circuit, the second-second main pixel circuit and the second-second main display element being located at the second portion of the main display area; and
a second data line electrically connected to the second-first main pixel circuit and the second-second main pixel circuit, the second data line extending in the first direction to pass the first portion of the main display area, the intermediate area, and the second portion of the main display area.

13. The display apparatus of claim 12, wherein the second-first main display element and the second-second main display element are located at a same column as each other, the column extending in the first direction.

14. The display apparatus of claim 12, wherein the second horizontal connection line crosses the second data line, and the second horizontal connection line is located at a layer different from that of the second data line.

15. The display apparatus of claim 8, wherein at least a portion of the second peripheral connection line is located at a peripheral area outside the main display area.

16. The display apparatus of claim 8, further comprising:
a first bridge line located between the first vertical connection line and the first peripheral connection line to electrically connect the first vertical connection line to the first peripheral connection line; and
a second bridge line located between the second vertical connection line and the second peripheral connection line to electrically connect the second vertical connection line to the second peripheral connection line.

17. The display apparatus of claim 16, wherein the first peripheral connection line is located at a layer different from that of the second peripheral connection line.

18. The display apparatus of claim 16, wherein the first peripheral connection line crosses the second peripheral connection line, and the first peripheral connection line is located at a layer different from that of the second peripheral connection line.

19. The display apparatus of claim 16, wherein the first bridge line and the second bridge line are each located on an insulating layer covering one of the first peripheral connection line or the second peripheral connection line.

20. The display apparatus of claim 19, wherein another of the first peripheral connection line or the second peripheral connection line is located on an insulating layer covering the first bridge line and the second bridge line.

* * * * *